United States Patent
Sakakida et al.

(10) Patent No.: US 11,469,758 B2
(45) Date of Patent: Oct. 11, 2022

(54) HIGH FREQUENCY SWITCH

(71) Applicant: DENSO CORPORATION, Kariya (JP)

(72) Inventors: Isao Sakakida, Kariya (JP); Kensuke Nakajima, Kariya (JP); Shuya Kishimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/326,792

(22) Filed: May 21, 2021

(65) Prior Publication Data

US 2021/0281261 A1 Sep. 9, 2021

Related U.S. Application Data

(63) Continuation of application No. PCT/JP2019/042362, filed on Oct. 29, 2019.

(30) Foreign Application Priority Data

Nov. 26, 2018 (JP) .............................. JP2018-220253

(51) Int. Cl.
| | |
|---|---|
| *H03K 17/04* | (2006.01) |
| *H03K 17/16* | (2006.01) |
| *H03K 17/687* | (2006.01) |
| *H03K 17/693* | (2006.01) |
| *H04B 1/44* | (2006.01) |
| *H01P 1/15* | (2006.01) |
| *H01P 3/02* | (2006.01) |
| *H04B 1/48* | (2006.01) |

(52) U.S. Cl.
CPC ............. *H03K 17/693* (2013.01); *H01P 1/15* (2013.01); *H01P 3/02* (2013.01); *H04B 1/48* (2013.01)

(58) Field of Classification Search
None
See application file for complete search history.

(56) References Cited

U.S. PATENT DOCUMENTS

| | | | |
|---|---|---|---|
| 6,104,844 A | 8/2000 | Alger-Meunier | |
| 6,731,184 B1* | 5/2004 | Muto | H04B 1/48 |
| | | | 333/103 |
| 8,222,949 B2* | 7/2012 | Stiebler | H03K 17/693 |
| | | | 327/427 |
| 2018/0131368 A1* | 5/2018 | Lu | H04B 1/44 |
| 2019/0199347 A1* | 6/2019 | Joo | H03K 17/693 |
| 2019/0296726 A1* | 9/2019 | Kolcuoglu | H03K 17/693 |

(Continued)

FOREIGN PATENT DOCUMENTS

WO 2001/095075 A1 12/2001

OTHER PUBLICATIONS

Bon-Hyun Ku et al., "A High-Linearity 76-85-GHz 16-Element 8-Transmit/8-Receive Phased-Array Chip With High Isolation and Flip-Chip Packaging", IEEE Transactions On Microwave Theory and Techniques, vol. 62, No. 10, Oct. 2014.

(Continued)

*Primary Examiner* — Kenneth B Wells
(74) *Attorney, Agent, or Firm* — Posz Law Group, PLC

(57) ABSTRACT

A high frequency switch configured to switch paths of differential signals arranged in an integrated circuit. The high frequency switch includes a pair of pole terminals and a plurality of pairs of throw terminals. The pair of pole terminals constitutes one port. Each pair of throw terminals constitutes another port.

14 Claims, 17 Drawing Sheets

(56) References Cited

U.S. PATENT DOCUMENTS

2020/0014381 A1* 1/2020 Zhu ............... H01L 27/1203
2022/0013415 A1* 1/2022 Blin ................ H01L 21/84

OTHER PUBLICATIONS

Xinwang Zhang et al., "A 0.5-30GHz Wideband Differential CMOS T/R Switch with Independent Bias and Leakage Cancellation Techniques", 2015 IEEE International Symposium on Circuits and Systems , May 24-27, 2015.

Hyun-Woong Kim et al., "A High Power CMOS Differential T/R Switch using Multi-section Impedance Transformation Technique", 2010 IEEE Radio Frequency Integrated Circuits Symposium , May 23-25, 2010.

Y.Mo et al., "An LO Power Distribution Network Design for Integrated 60-GHz Transceiver on Chip", 2009 IEEE 8th International Conference on ASIC, pp. 292-295.

"Peregrine Semiconductor, Product Specification / PE42920" Peregrine Semiconductor Corp., 2012-2015, Document No. DOC-12914-3.

Pozar, David M., "Microwave Engineering," Wiley Global Education, 4th Edition, 2011, p. 328.

* cited by examiner

HIGH FREQUENCY SWITCH

CROSS REFERENCE TO RELATED APPLICATIONS

The present application is a continuation application of International Patent Application No. PCT/JP2019/042362 filed on Oct. 29, 2019, which designated the U.S. and claims the benefit of priority from Japanese Patent Application No. 2018-220253 filed on Nov. 26, 2018. The entire disclosures of all of the above applications are incorporated herein by reference.

TECHNICAL FIELD

The present disclosure relates to a high frequency switch.

BACKGROUND

In a technical field of high frequency circuit, a Wilkinson power distributor is used to distribute power. Although the Wilkinson power distributor can distribute power evenly, a λ/4 transmission line is required. The λ/4 transmission line, which has effective relative permittivity of 3.5, requires, for example, about 1000 μm at 40 GHz. When the Wilkinson power distributor is incorporated into an integrated circuit, required layout area tends to be large.

SUMMARY

The present disclosure provides a high frequency switch. The high frequency switch configured to switch paths of differential signals arranged in an integrated circuit. The high frequency switch includes a pair of pole terminals and a plurality of pairs of throw terminals. The pair of pole terminals constitutes one port. Each pair of throw terminals constitutes another port.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
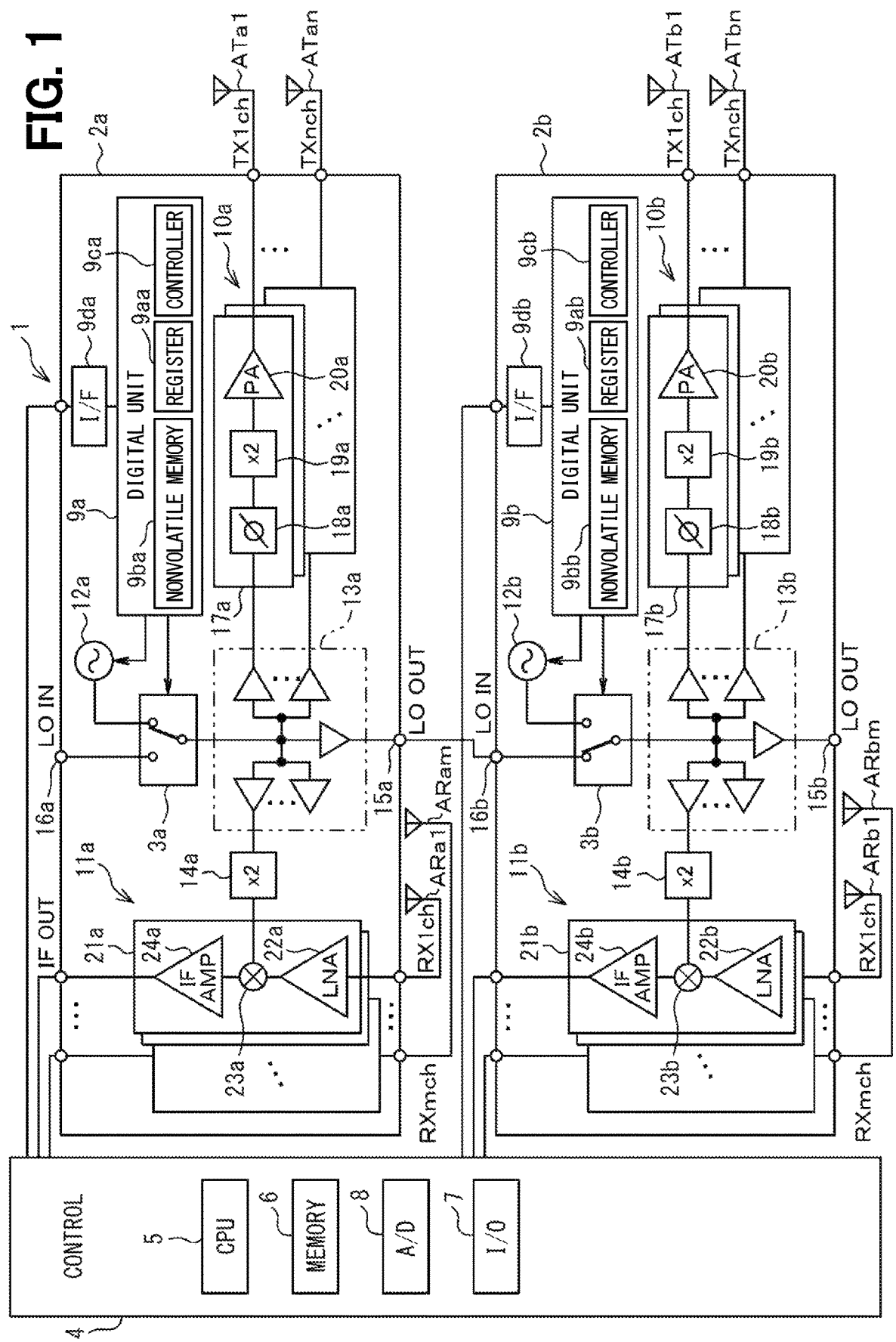
FIG. 1 is an overall configuration diagram showing a millimeter wave radar system according to a first embodiment.

For example, as a device that switches, at an antenna end, paths for performing transmission and reception by wireless communication, a high frequency switch such as a Single Pole Double Throw (SPDT) is known. A circuit for switching a transmission and reception path using a Complementary Metal Oxide Semiconductor (CMOS) switch has been disclosed. Since this circuit is intended for the frequency band of 0.5 to 30 GHz, return loss and insertion loss in the frequency band of the millimeter wave band of 30 GHz or more may deteriorate.

Further, a configuration in which a parallel switch is configured between a node on one side and the ground has been described. In this case, since an extra parasitic impedance is generated between a shunt switch and the ground node, an occupied area is enlarged. Further, a circuit that distributes a high frequency signal by providing a buffer amplifier before and after branching has been disclosed. However, when the buffer amplifier is provided, a layout area is enlarged and power of the amplifier is increased.

The present disclosure provides a high frequency switch capable of improving characteristics even at high frequency such as millimeter waves.

An exemplary embodiment of the present disclosure provides a high frequency switch. The high frequency switch switches paths of differential signals arranged in an integrated circuit. The high frequency switch includes a pair of pole terminals, a plurality of pairs of throw terminals, a plurality of inductors, a plurality of parallel connection switches, and a plurality of series connection switches. The pair of pole terminals constitute one port. Each pair of throw terminals constitute another port. Each of the plurality of inductors is connected (i) between each throw terminal and a ground node or (ii) between the throw terminals of each pair. The plurality of inductors are connected in parallel. Each of the plurality of parallel connection switches is connected between the throw terminals of each pair. The plurality of parallel connection switches are connected in parallel. Each of the plurality of series connection switches is connected between each throw terminal and a corresponding pole terminal.

In the exemplary embodiment of the present disclosure, the configuration can improve the characteristics even at high frequency such as millimeter waves.

Several embodiments for high frequency switches are hereinafter described with reference to the drawings. In each of the embodiments described below, the same or similar reference numerals are attached to the same or similar configuration, and the description is omitted as necessary.

First Embodiment

FIGS. 1 to 6F are explanatory views of a first embodiment. A millimeter wave radar system 1 shown in FIG. 1 measures, for example, a distance to a target or a relative speed by emitting a modulated radio wave in the 79 GHz band in front of the subject vehicle and measuring the wave reflected from the target. The millimeter wave radar system 1 will be described. In this embodiment, high frequency switches 3a and 3b are respectively incorporated into integrated circuits 2a and 2b that constitutes the millimeter wave radar system 1.

In the millimeter wave radar system 1, the two integrated circuits 2a and 2b having the same structure is connected with each other and a controller 4 is connected to each of the integrated circuits 2a and 2b. The controller 4 is configured by a microcomputer having a CPU 5, a memory 6 such as a ROM and a RAM, an I/O 7, and an A/D converter 8. The function of the controller 4 may be included in the integrated circuits 2a and 2b. However, the function related to control will be described assuming that the function is included in the controller 4 other than the integrated circuits 2a and 2b.

The two integrated circuits 2a and 2b are each integrated into one chip. Although the two integrated circuits 2a and 2b have the same structure, the two integrated circuits 2a and 2b are used in different control states. Therefore, the same circuit component is indicated by a subscript a inside the integrated circuit 2a in FIG. 1, and the same circuit component is indicated by b subscript a inside the integrated circuit 2b in FIG. 1.

The integrated circuit 2a includes a digital unit 9a, an interface 9da, a transmission unit 10a, a reception unit 11a, a Phase Locked Loop (PLL) 12a, a local oscillation signal distribution amplifier 13a, a frequency doubler 14a, and a high frequency switch 3a. The digital unit 9a includes a circuit control register 9aa, a non-volatile memory 9ba, and a control unit 9ca, and is capable of communicating with the controller 4 via the interface 9da.

Similarly, the integrated circuit 2b includes a digital unit 9b, an interface 9db, a transmission unit 10b, a reception unit 11b, a PLL 12b, a local oscillation signal distribution amplifier 13b, a frequency doubler 14b, and a high frequency switch 3b. The digital unit 9b includes a circuit control register 9ab, a non-volatile memory 9bb, and a control unit 9cb, and is capable of communicating with the controller 4 via the interface 9db.

Further, the integrated circuit 2a includes a local oscillation signal output port 15a and a local oscillation signal input port 16a. The local oscillation signal output port 15a outputs a local oscillation signal to the outside. The local oscillation signal input port 16a inputs a local oscillation signal from the outside. The integrated circuit 2b also includes a local oscillation signal input port 16b for sharing the same local oscillation signal as the other integrated circuit 2a. The integrated circuit 2b also includes a local oscillation signal output port 15b for outputting the same local oscillation signal to the outside.

The controller 4 stores a flag that causes the circuit control register 9aa of the integrated circuit 2a to function as a master via the interface 9da. The controller 4 stores a flag that causes the circuit control register 9ab of the integrated circuit 2b to function as a slave via the interface 9db. Further, the controller 4 writes various control parameters to the circuit control registers 9aa and 9ab of the integrated circuits 2a and 2b to perform command processing and circuit control processing to the integrated circuits 2a and 2b.

In the following description, the integrated circuit 2a that functions as a master will be referred to as a master integrated circuit 2a. Further, the integrated circuit 2b that functions as a slave is referred to as a slave integrated circuit 2b. FIG. 1 shows the high frequency signal simplified by a single wire, which is transmitted between the blocks inside the integrated circuits 2a and 2b. The high frequency signal transmitted between the blocks may be converted into a single phase signal or a differential signal by a balun as necessary. Further, in the millimeter-wave radar system 1 shown in FIG. 1, a configuration example of a radar in which two integrated circuits 2a and 2b having the same structure are respectively assigned to a master and a slave, and the number of transmission and reception channels is increased will be described. However, even when one integrated circuit is used, the configuration can operate as a radar.

The PLLs 12a and 12b respectively mounted on the integrated circuits 2a and 2b include a Voltage Controlled Oscillator (VCO) and a feedback loop circuit for controlling the output signal of the VCO. The VCO and the feedback loop circuit are not shown in figures. The control unit 9ca of the master integrated circuit 2a, based on a flag and a parameter stored in the circuit control register 9aa, causes the PLL 12a to generate a local oscillation signal modulated by a method such as Frequency Modulated Continuous Wave (FMCW) and to output the modulated signal to a high frequency switch 3a. On the other hand, the control unit 9cc of the slave integrated circuit 2b stops the operation of the PLL 12b by referring to the flag of the circuit control register 9ab in the digital unit 9b.

The high frequency switches 3a and 3b of the integrated circuits 2a and 2b have two inputs and one output, and the details thereof will be described later. The digital units 9a and 9b respectively switch the paths of the high frequency switches 3a and 3b based on the flag stored in the circuit control registers 9aa and 9ab. The control unit 9ca of the digital unit 9a refers to the flag of the circuit control register 9aa and switches the path of the high frequency switch 3a of the master integrated circuit 2a so as to connect the PLL 12a and the local oscillation signal distribution amplifier 13a.

The control unit 9cb of the digital unit 9b refers to the flag of the circuit control register 9ab and switches the path of the high frequency switch 3b of the slave integrated circuit 2b so as to connect the local oscillation signal input port 16b and the local oscillation signal distribution amplifier 13b. As a result, the signal generated by the PLL 12a of the master integrated circuit 2a is transmitted to the internal transmission unit 10a and the reception unit 11a through the local oscillation signal distribution amplifier 13a. Further, the signal generated by the PLL 12a of the master integrated circuit 2a is also transmitted to the transmission unit 10b and the reception unit 11b of the integrated circuit 2b through the local oscillation signal output port 15a and the local oscillation signal input port 16b.

Further, the local oscillation signal output port 15a of the master integrated circuit 2a and the local oscillation signal input port 16b of the slave integrated circuit 2b are connected with each other through a transmission line (not shown) on a printed circuit board on which the integrated circuits 2a and 2b are mounted. The printed circuit board can reduce the loss and reflection of high frequency signal by adopting a transmission line structure in which the characteristic impedance $Z_0$ is defined.

The transmission units 10a and 10b respectively include transmitters 17a and 17b for each of the radar transmission channels TX1ch to TXnch. In the present embodiment, since the two integrated circuits 2a and 2b are connected, it is possible to configure two sets of transmission channels TX1ch to TXnch for n channels, that is, 2×n transmission channels.

The transmitters 17a and 17b are configured by sequentially connecting phase shifters 18a and 18b, frequency doublers 19a and 19b, and power amplifiers 20a and 20b, respectively. The phase shifters 18a and 18b control the phase of each transmission channel TX1ch to TXnch. Further, although the phase shifters 18a and 18b are respectively connected prior to the frequency doublers 19a and 19b, the phase shifters 18a and 18b can be respectively placed subsequent to the frequency doublers 19a and 19b. In FIG. 1, a case where the phase shifters 18a and 18b are respectively provided in the preceding stage of the frequency doublers 19a and 19b will be described as an example. Further, in the first embodiment, an example using the frequency doublers 19a and 19b is shown, but a frequency tripler that outputs a frequency three times the input signal frequency may be used.

The output of the transmitter 17a in each transmission channel TX1ch to TXnch is connected to a feeding point of each of the antenna elements ATa1 to ATan formed on the printed circuit board, respectively. The output of the transmitter 17b in each transmission channel TX1ch to TXnch is connected to the feeding point of each of the antenna elements ATb1 to ATbn formed on the printed circuit board, respectively. The radio waves are radiated toward the target from the antenna elements ATa1 to ATan and the antenna elements ATb1 to ATbn.

The reception units 11a and 11b respectively include receivers 21a and 21b for each of the radar reception channels RX1ch to RXmch. Here, the number of transmission channels n may be the same as or different from the number of reception channels m. The receiver 21a of each of the reception channels RX1ch to RXmch includes a Low Noise Amplifier (LNA) 22a, a mixer 23a, and an intermediate frequency amplifier 24a. The LNA 22a, the mixer 23a, and the intermediate frequency amplifier 24a are connected to the antenna elements ARa1 to ARam of the reception channels RX1ch to RXmch. The receiver 21b of each of the reception channels RX1ch to RXmch also includes an LNA 22b, a mixer 23b, and an intermediate frequency amplifier 24b. The LNA 22b, the mixer 23b, and the intermediate frequency amplifier 24b are connected to the antenna elements ARb1 to ARbm of the reception channels RX1ch to RXmch.

The waves reflected from the target is input to the reception units 11a and 11b via the plurality of antenna elements ARa1 to ARam and ARb1 to ARbm. The LNAs 22a and 22b of the reception units 11a and 11b amplify the received signal and output the amplified signal to the mixers 23a and 23b, respectively. The mixers 23a and 23b respectively convert the frequency of the reception signal into an intermediate frequency by the local oscillation signal from the frequency doublers 14a and 14b.

The intermediate frequency amplifiers 24a and 24b are provided by, for example, variable gain amplifiers. The intermediate frequency amplifiers 24a and 24b respectively amplifier the intermediate frequency signals after frequency conversion by the mixers 23a and 23b based on the parameters set in the circuit control registers 9aa and 9ab and output the amplified signals to the A/D converter 8 of the controller 4. In the first embodiment of FIG. 1, the A/D converter 8 is built in the controller 4, but the A/D converter 8 may be built in each of the integrated circuits 2a and 2b. The controller 4 calculates the distance to the target and the relative speed by executing signal processing based on the digital data converted by the A/D converter 8.

As described above, when the integrated circuits 2a and 2b are connected with a master-slave relationship, the number of transmission channels n and the number of reception channels m can be increased as a whole system. Since the master integrated circuit 2a and the slave integrated circuit 2b use the output signal from the PLL 12a mounted on the master integrated circuit 2a as a local oscillation signal, the master integrated circuit 2a and the slave integrated circuit 2b operate in synchronization with each other.

Hereinafter, the configuration of the high frequency switches 3a and 3b used in the master integrated circuits 2a and the slave integrated circuits 2b will be described in detail. Hereinafter, the high frequency switches 3a and 3b will be collectively referred to as a high frequency switch 3 or any one of them will be referred to as the high frequency switch 3.

In the example shown in FIG. 1, the high frequency switches 3a and 3b are used as switches having a function of two inputs and one output, respectively, but the high frequency switch 3 itself can be operated by exchanging input and output. That is, the high frequency switch 3 can be operated with one input and two outputs.

Figure 2:
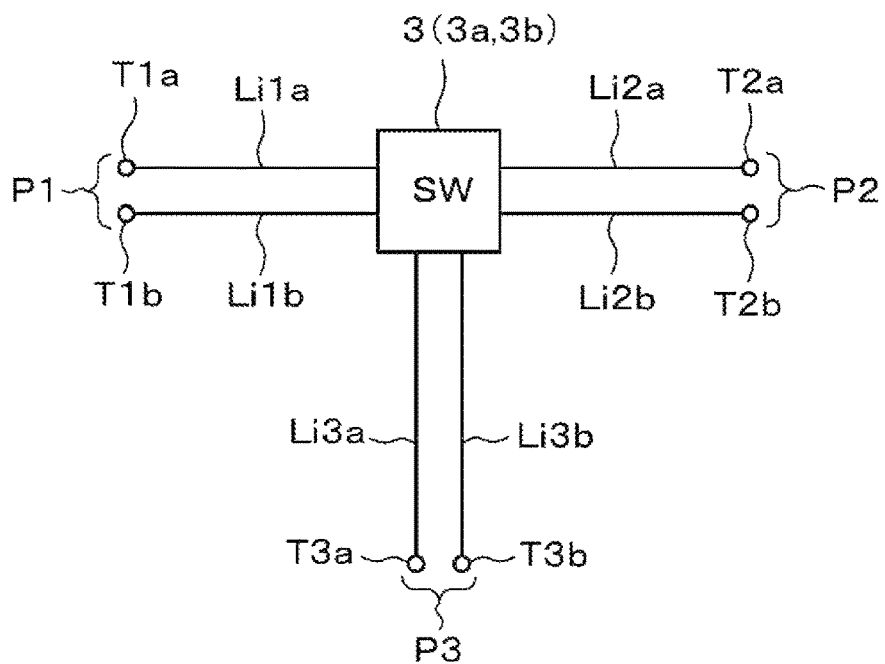
FIG. 2 is an explanatory diagram showing a high frequency switch.

As shown in FIG. 2, the high frequency switch 3 includes a first port P1, a second port P2, and a third port P3. The first port P1 and the second port P2 are throw ports. The first port P1 includes a pair of terminals (hereinafter referred to as throw terminals) T1a and T1b, and the second port P2 includes a pair of terminals (hereinafter referred to as throw terminals) T2a and T2b. The pair of terminals T1a and T1b of the first port P1 are respectively referred to as a first throw terminal T1a and a second throw terminal T1b. The pair of terminals T2a and T2b of the second port P2 are respectively referred to as a third throw terminal T2a and a fourth throw terminal T2b. The third port P3 is a pole port, and the third port P3 also includes a pair of terminals (hereinafter, referred to as pole terminals) T3a and T3b. The pair of terminals T3a and T3b of the third port P3 are respectively referred to as a first pole terminal T3a and a second pole terminal T3b. As a result, the high frequency switch 3 operates as a differential SPDT.

A pair of differential signal lines Li1a-Li1b, Li2a-Li2b, and Li3a-Li3b are respectively connected to the ports P1 to P3. The pair of differential signal lines Li1a-Li1b, Li2a-Li2b, and Li3a-Li3b are provided by one signal lines Li1a, Li2a, and Li3a (referred to as a positive phase signal line) and the other signal line Li1b, Li2b, and Li3b (referred to as a reverse phase signal line).

As shown in FIG. 1, the first port P1 of the high frequency switch 3 is a port connected to the local oscillation signal input port 16a or 16b. Further, the second port P2 of the high frequency switch 3a is a port connected to PLL 12a of the integrated circuits 2a or the PLL 12b of the integrated circuits 2b.

Figure 3:
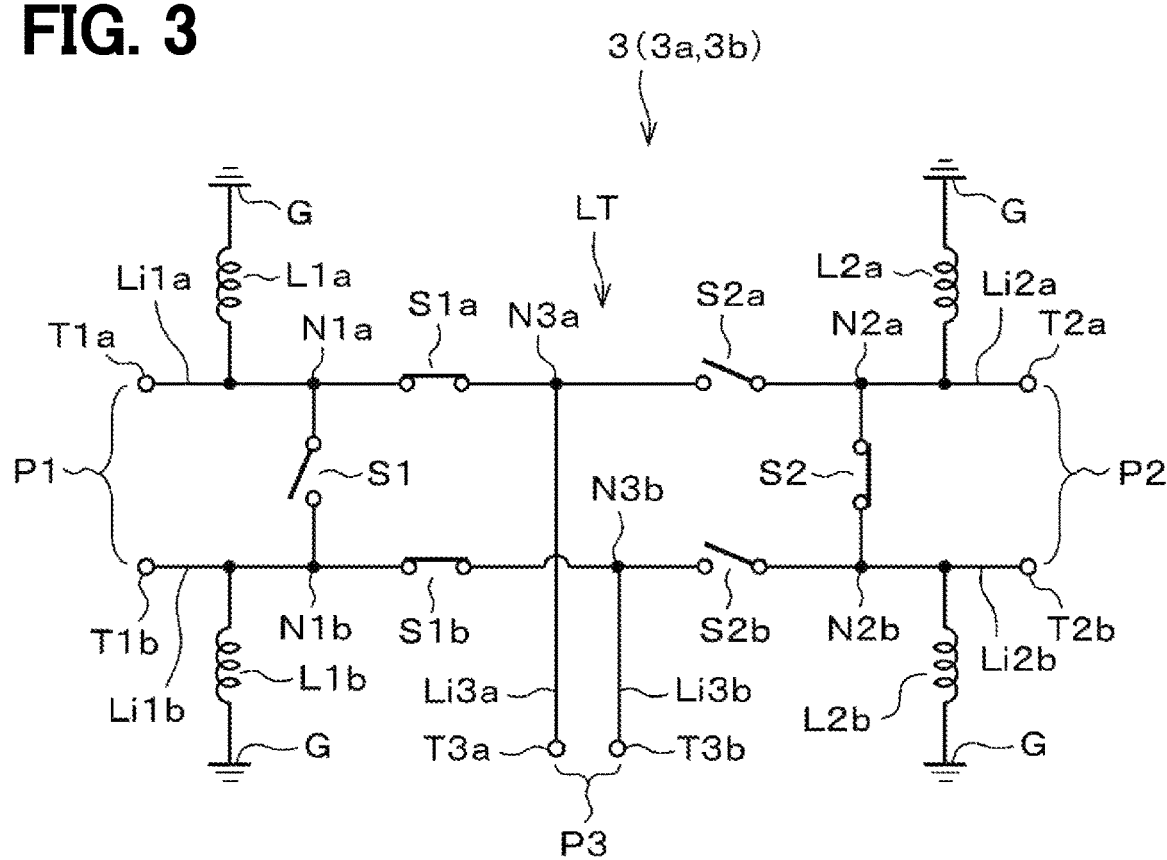
FIG. 3 is a circuit diagram showing the high frequency switch.

FIG. 3 shows a circuit diagram of the high frequency switch 3. Inductor L1a, which is also referred to as a first inductor L1a, is connected between the signal line Li1a and the ground node G. The signal line Li1a is connected to the throw terminal T1a of the first port P1. Inductor L1b, which is also referred to as a second inductor L1b, is connected between the signal line Li1b and the ground node G. The signal line Li1b is connected to the throw terminal T1b of the first port P1. Further, a parallel connection switch S1, which is also referred to as a first parallel connection switch S1, is connected between the node N1a of the signal line Li1a and the node N1b of the signal line Li1b.

Inductor L2a, which is also referred to as a third inductor L2a, is connected between the signal line Li2a and the ground node G. The signal line Li2a is connected to the throw terminal T2a of the second port P2. Inductor L2b, which is also referred to as a fourth inductor L2b, is connected between the signal line Li2b and the ground node G. The signal line Li2b is connected to the throw terminal T2b of the second port P2. Further, a parallel connection switch S2, which is also referred to as a second parallel connection switch S2, is connected between the node N2a of the signal line Li2a and the node N2b of the signal line Li2b.

Figure 5A:
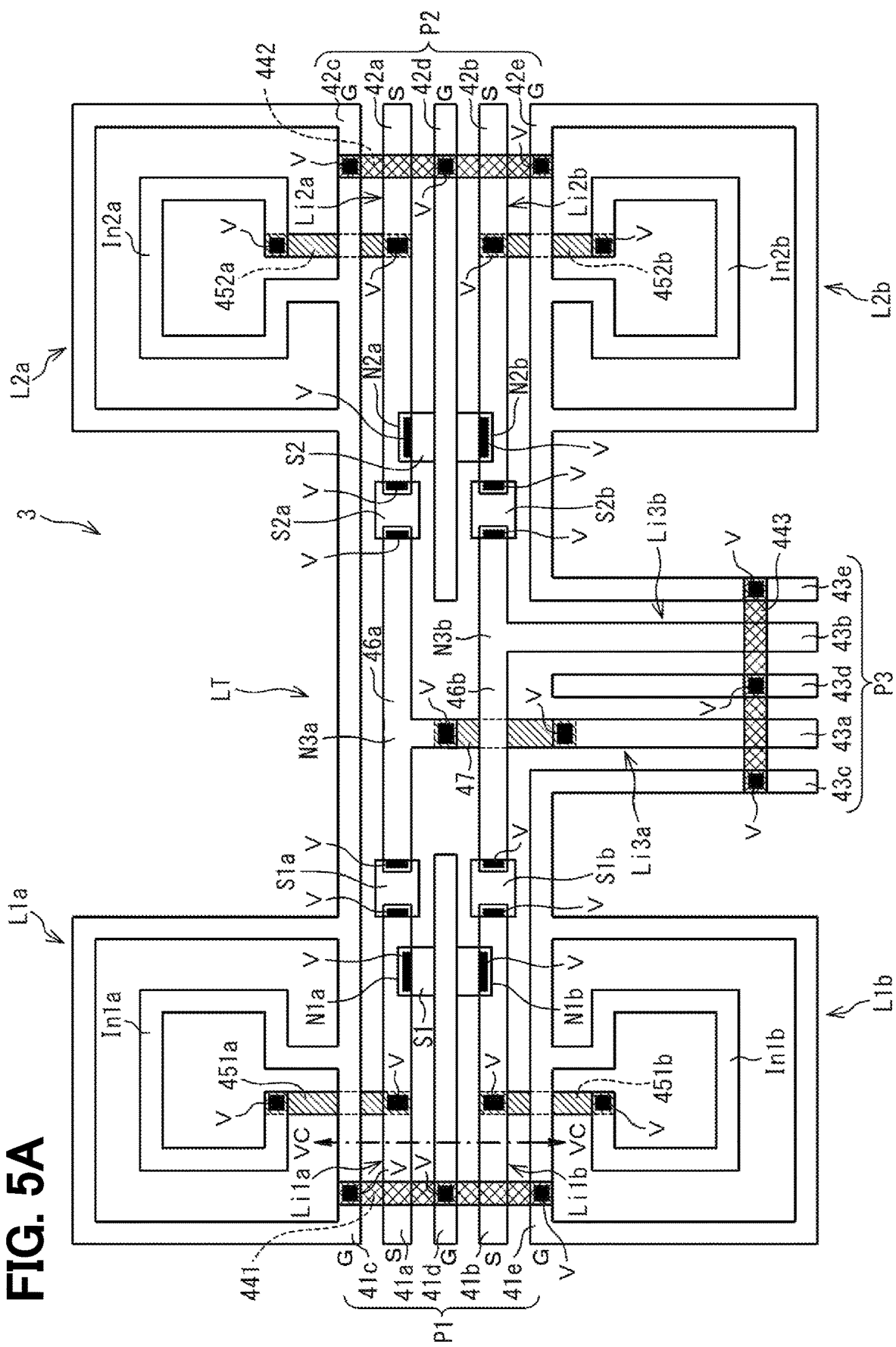
FIG. 5A is a diagram showing a layout configuration.

The inductors L1a, L1b, L2a, and L2b are provided for impedance matching at high frequencies. The inductors L1a, L1b, L2a, and L2b are respectively provided by spiral inductors In1a, In1b, In2a, and In2b on integrated circuits 2a and 2b as shown in FIG. 5A described later.

Further, a series connection switch S1a, which is also referred to as a first series connection switch S1a, is connected between the throw terminal T1a and the pole terminal T3a. A series connection switch S1b, which is also referred to as a second series connection switch S1b, is connected between the throw terminal T1b and the pole terminal T3b. A T-shaped branch path LT is formed between the pair of series connection switches S1a and S1b and the third port P3.

Further, a series connection switch S2a, which is also referred to as a third series connection switch S2a, is connected between the throw terminal T2a and the pole terminal T3a. A series connection switch S2b, which is also referred to as a fourth series connection switch S2b, is connected between the throw terminal T2b and the pole terminal T3b. A T-shaped branch path LT is formed between the pair of series connection switches S2a and S2b and the third port P3.

The T-shaped branch path LT branches the lines between the first port P1 and the second port P2 and the lines extending from the node N3a and N3b between the first port P1 and the second port P2 to the third port P3. That is, the T-shaped branch path LT branches at the coupling nodes N3a and N3b on the line layout.

Figure 4A:
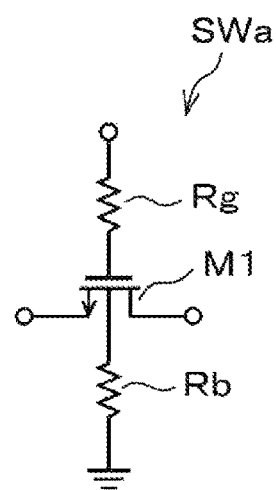
FIG. 4A is a first configuration example of a series connection switch and a parallel connection switch.
Figure 4B:
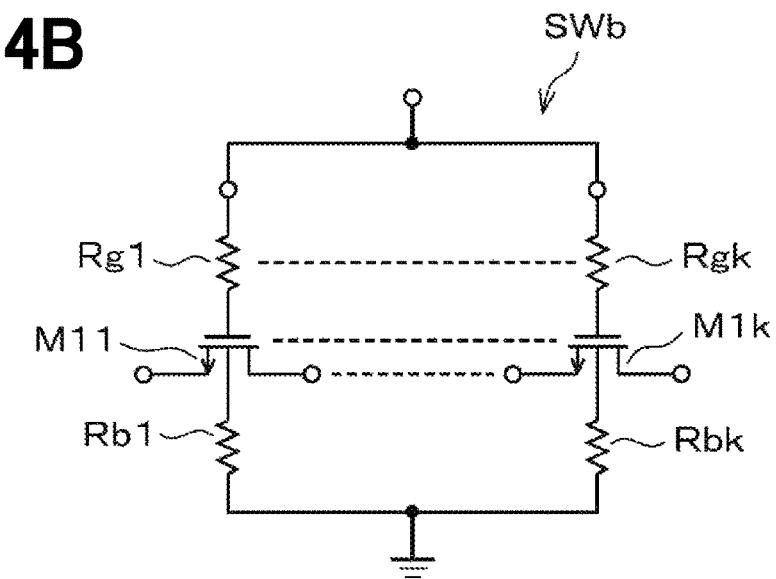
FIG. 4B is a second configuration example of the series connection switch and the parallel connection switch.

FIGS. 4A and 4B show a circuit of each of the parallel connection switches S1 and S2 and the series connection switches S1a, S1b, S2a, and S2b. Each of the switches S1, S2, S1a, S1b, S2a, and S2b is provided by a switch SWa having one stage or a switch SWb having multiple k-stages.

The switch SWa shown in FIG. 4A has a single transistor of an n-channel type MOSFET M1. A gate resistor Rg having a high resistance value for reducing the loss of high frequency signals is connected to a gate of the switch SWa. A back gate resistor Rb having a high resistance value is connected between a back gate of the switch SWa and a ground node G.

When voltage amplitude with high frequency applied between the source and drain of the MOSFET M1 becomes high, as shown in FIG. 4B, a switch SWb composed of multiple stages of MOSFETs M11 to M1$k$ may be used. The switch SWb shown in FIG. 4B is configured such that unit switches, each of which is the switch SWa shown in FIG. 4A, are provided as k-th staged switch. The switch SWb shown in FIG. 4B connects the drain of one of the MOSFETs M11 to M1$k$ to the source of the adjacent one of the MOSFETs M11 to M1$k$. Further, FIG. 4B shows gate resistances Rg1 to Rgk and back gate resistances Rb1 to Rbk which correspond to the gate resistance Rg and the back gate resistance Rb of FIG. 4A and are provided with subscripts 1 to k. At this time, the applied voltage can be divided by the plurality of MOSFETs M11 to M1$k$, and the withstand voltage of the switch SWb can be improved.

Further, in order to eliminate floating in the source and drain of the MOSFET M1 and the MOSFETs M11 to M1$k$, a jumper resistor having a high resistance value is inserted between the source and drain. In FIGS. 4A and 4B, the jumper resistor is omitted. Further, each of the MOSFET M1 and the MOSFETs M11 to M1$k$ may have a triple well structure, but the resistance having a high resistance value connected to the deep N well in this case is also omitted. According to the switches SWa and SWb shown in FIGS. 4A and 4B, the ON/OFF state of the switches SWa and SWb can be switched by changing the control signal applied to the gates of the MOSFET M1 and the MOSFETs M11 to M1$k$ from the outside.

In FIGS. 4A and 4B, the switches SWa and SWb are respectively configured by the n-channel type MOSFET M1 and the n-channel type MOSFETs M11 to M1$k$, but the configuration is not limited thereto, and other types of transistors can be used. Further, the switches SWa and SWb can be applied to both the case of using a bulk silicon substrate 31 described later and the case of using a Silicon on Insulator (SOI) substrate.

Figure 4C:
FIG. 4C is an equivalent circuit diagram showing the series connection switch and the parallel connection switch in ON state.
Figure 4D:
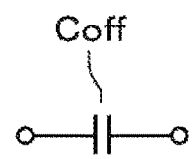
FIG. 4D is an equivalent circuit diagram showing the series connection switch and the parallel connection switch in OFF state.

FIG. 4C shows an equivalent circuit when the MOSFET M1 or the MOSFETs M11 to M1$k$ are on, and FIG. 4D shows an equivalent circuit when the MOSFET M1 or the MOSFETs M11 to M1$k$ are off. When the MOSFET M1 or the MOSFETs M11 to M1$k$ are on, as shown in FIG. 4C, the source and drain of the MOSFET M1 or the MOSFETs M11 to M1$k$ can be represented by an equivalent circuit with an on-resistance Ron. At this time, the value of the on-resistance Ron is inversely proportional to the gate width of the MOSFET M1 or the MOSFETs M11 to M1$k$. When the MOSFET M1 or the MOSFETs M11 to M1$k$ are off, as shown in FIG. 4D, the source and drain of the MOSFET M1 or the MOSFETs M11 to M1$k$ can be represented by an equivalent circuit with an off capacitance Coff. The value of the off capacitance Coff is proportional to the gate width of the MOSFET M1 or the MOSFETs M11 to M1$k$.

It is desirable that each of the four series connection switches S1a, S1b, S2a, and S2b has the same value for the gate width and the gate length for approximating the frequency characteristics of the first port P1, the frequency characteristics of the second port P2, and the frequency characteristics of the third port P3. Further, for the same reason, it is desirable that the gate width and the gate length of the two parallel connection switches S1 and S2 have the same value. When it is not necessary to approximate various characteristics such as the frequency characteristics of the return loss at each port P1, P2, and P3, the values do not necessarily have to be the same.

When the power of the high frequency signal to be handled is high, the voltage amplitude between the source and drain of the parallel connection switch S1 or S2 may be higher than that of the series connection switches S1a, S1b, S2a, and S2b. Therefore, it is desirable that the parallel connection switches S1 and S2 are configured by forming MOSFETs M11 to M1k in multiple stages as shown in FIG. 4B. Further, it is desirable that the four inductors L1a, L1b, L2a, and L2b have the same inductance value. This is for approximating various characteristics such as the frequency characteristic of the return loss at each of the ports P1, P2, and P3 as described above.

As shown in FIG. 3, it is assumed that the series connection switches S1a and S1b are on, the series connection switches S2a and S2b are off, the parallel connection switch S1 is off, the parallel connection switch S2 is on, and the first port P1 and the third port P3 are in a conductive state. In this case, the frequency characteristic is determined by the resonance frequency determined based on the combined capacitance of the off capacitance Coff of the parallel connection switch S1 and the off capacitance Coff of the series connection switches S2a and S2b, and the inductance values of the inductors L1a and L1b. The resonance frequency is included in a predetermined operating frequency band used in the millimeter wave radar system 1.

On the other hand, although not shown, it is assumed that the series connection switches S1a and S1b are off, the series connection switches S2a and S2b are on, the parallel connection switch S1 is on, the parallel connection switch S2 is off, and the second port P2 and the third port P3 are in a conductive state. In this case, the frequency characteristic is determined by the resonance frequency determined based on the combined capacitance of the off capacitance Coff of the parallel connection switch S2 and the off capacitance Coff of the series connection switches S1a and S1b, and the inductance values of the inductors L2a and L2b. The resonance frequency is included in a predetermined operating frequency band used in the millimeter wave radar system 1.

Therefore, as described above, the gate width and gate length of the MOSFET M1 or the MOSFETs M11 to M1k constituting the switches S1a, S1b, S2a, or S2b are similar to the gate width and gate length of the MOSFET M1 or the MOSFETs M11 to M1k constituting the switches S1 or S2. Further, when the inductors L1a, L1b, L2a, and L2b have the same inductance value, the frequency characteristic of the isolation $S_{21}$ between the first port P1 and the second port P2, and the frequency characteristic of the isolation $S_{32}$ between the second port P2 and the third port P3 can be approximated with each other.

Similarly, the frequency characteristics of the return loss $S_{11}$ of the first port P1 and the frequency characteristics of the return loss $S_{22}$ of the second port P2 can be approximated with each other. The various design parameters may be set in consideration of parasitic components in transmission lines and ground lines other than the series connection switches S1a, S1b, S2a, and S2b, parallel connection switches S1 and S2 and inductors L1a, L1b, L2a and L2b.

Figure 5B:
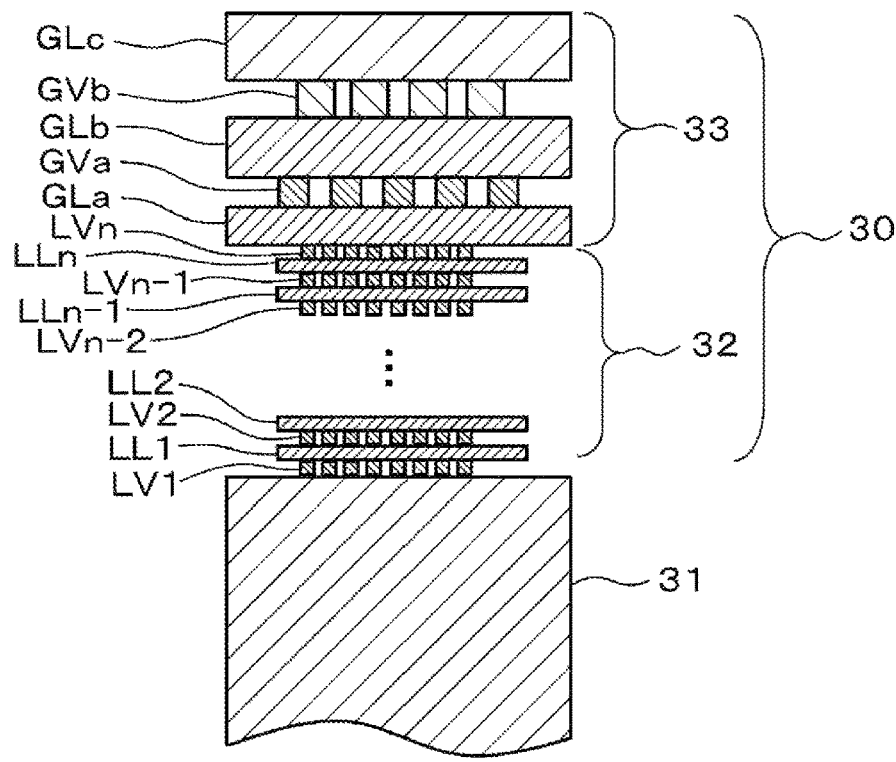
FIG. 5B is an explanatory diagram showing a layer configuration.

FIG. 5A shows an example of a layout when the circuit diagram shown in the high frequency switch 3 of FIG. 2 is applied to the operation in the millimeter wave band. This exemplary layout is designed to ensure high frequency characteristics near 38 GHz. FIG. 5B is an explanatory diagram schematically showing the definition of the layer.

As shown in FIG. 5B, a wiring layer 30 is configured on the silicon substrate 31. The wiring layer 30 includes a local wiring 32 and a global wiring 33. The local wiring 32 connects elements in a relatively narrow area, and the global wiring 33 is located on the local wiring 32 and connects elements in a relatively wide area.

The local wiring 32 includes a plurality of local wiring layers LL1 to LLn connected to each other through vias LV1 to LVn. Similarly, the global wiring 33 includes a plurality of global wiring layers GLa to GLc connected to each other through vias GVa to GVb. Hereinafter, a part or all of the vias LV1 to LVn and GVa to GVb constituting the local wiring 32 and the global wiring 33 will be referred to as "via V" as necessary. Further, in FIG. 5A, a part of these vias LV1 to LVn and GVa to GVb is indicated as "V". The global wiring 33 is capable of having a thicker film and a wider wiring made of metal than the local wiring 32. Therefore, the global wiring 32 is suitable for configuring a transmission line having good high frequency characteristics such as Q value and a passive element such as various inductors in an integrated circuit.

The uppermost global wiring layer GLc is made of aluminum. On the other hand, the global wiring layer GLb under the global wiring layer GLc is made of copper. Therefore, the global wiring layer GLb has a low resistance value per unit length and good high frequency characteristics. Therefore, the global wiring layer GLb is suitable for constituting a passive element (for example, inductors L1a, L1b, L2a, and L2b) and a signal line of a transmission line (see below for details).

FIG. 5B shows an example of the cross-sectional structure of the local wiring 32 and the global wiring 33, but the structure is not limited to such a layer structure. For example, when the local wiring 32 and the global wiring 33 are configured using different semiconductor processes, the number and the film thickness of the local wiring layers LL1 to LLn and the global wiring layers GLa to GLc may differ. Even in such a case, the configuration can be applied by adjusting the design parameters and layout.

Figure 5C:
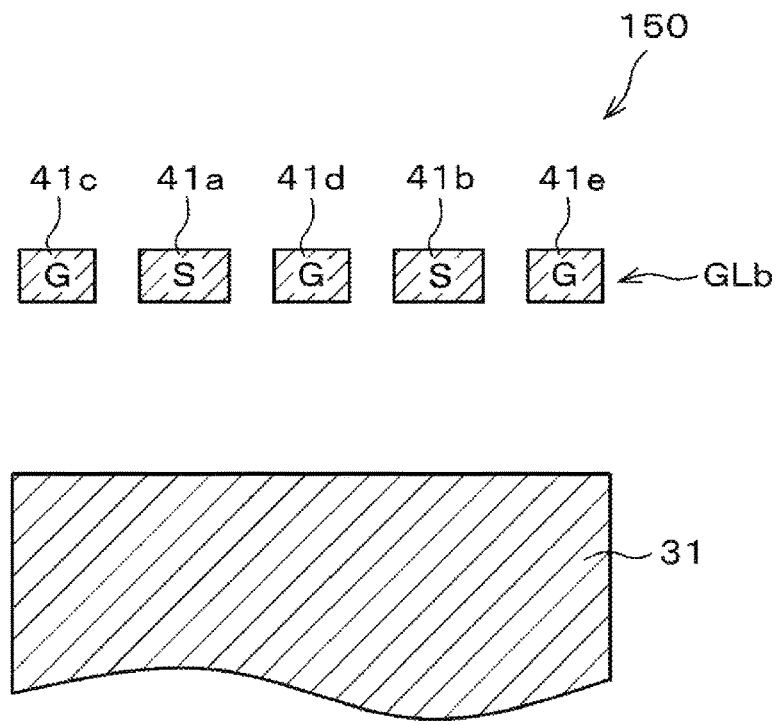
FIG. 5C is a cross-sectional view of a transmission line.

The connection between the elements constituting the high frequency switch 3 shown in FIG. 3, for example, the connection between the series connection switches gvS1a, S1b, S2a, and S2b, the parallel connection switches S1 and S2, and the inductors L1a, L1b, L2a, and L2b may be configured using a coplanar waveguide 150 shown in FIG. 5C. The coplanar waveguide 150 utilizes the global wiring layer GLb.

FIG. 5C shows a cross-sectional view of the coplanar waveguide 150 cut along the VC-VC line of FIG. 5A. The coplanar waveguide 150 is configured such that the two signal lines 41a and 41b constituting the differential signal line and the three ground lines 41c, 41d and 41e are alternately disposed apart from each other. As shown in FIG. 5C, the signal lines 41a and 41b and the ground lines 41c, 41d, and 41e may be disposed in the global wiring layer GLb below the global wiring layer GLc, which is the uppermost layer. This is because the high frequency characteristics are good as described above.

Although the cross-sectional view is omitted, on the second port P2 side, the coplanar waveguide 150 is configured such that the two signal lines 42a and 42b constituting the differential signal line and the three ground lines 42c, 42d and 42e are alternately disposed apart from each other. On the third port P3, the coplanar waveguide 150 is configured such that the two signal lines 43a and 43b constituting the differential signal line and the three ground lines 43c, 43d and 43e are alternately disposed apart from each other.

The wiring width of each of the signal lines 41a, 41b, 42a, 42b, 43a, and 43b and the ground lines 41c to 41e, 42c to 42e, 43c to 43e and the separation distance therebetween are determined such that the differential characteristic impedance $Z_0$ at each port P1 to P3 is approximately 100Ω. However, the value of the differential characteristic impedance $Z_0$ is not necessarily 100Ω, and is changed according to the request from the connected amplifier or the like. The widths of the three ground wires 41c to 41e, 42c to 42e, and 43c to 43e are the same as each other, and the widths of the two signal lines 41a, 41b, 42a, 42b, 43a, and 43b are also the same as each other. However, the reason why the ground lines 41c to 41e, 42c to 42e, 43c to 43e, and the signal lines 41a, 41b, 42a, 42b, 43a, and 43b have the same width is to ensure the symmetry of the differential line. This configuration is a commonly practiced means and is not limited.

The first ground wire 41c located at one end of the first port P1 extends in one direction from the first port P1 to the second port P2, and is connected to the first ground wire 42c of the second port P2. The second ground wire 41d located at the center of the first port P1 extends in parallel with the first ground wire 41c. The second ground wire 41d is configured from the first port P1 to the center of the high frequency switch 3. The second ground wire 42d is configured from the second port P2 to the center of the high frequency switch 3, but is separated from the second ground wire 41d.

The third ground wire 41e located at the other end of the first port P1 extends in parallel with the first ground wire 41c, and is configured over the center of the high frequency switch 3. The third ground wire 41e bents from the extended end toward the third port P3 and is connected to the first ground wire 43c. Similarly, the third ground wire 42e located at the other end of the second port P2 extends in parallel with the first ground wire 42c, and is configured over the center of the high frequency switch 3. The third ground wire 41e bents from the extended end toward the third port P3 and is connected to the third ground wire 43e. The second ground wire 43d located at the center of the third port P3 is configured to the center of the high frequency switch 3.

Further, in order to commonly connect the ground wires included in the high frequency switch 3 on the integrated circuits 2a and 2b, the ground strengthening line 441 is provided at a position close to the first port P1. The ground strengthening line 441 is configured in the uppermost global wiring layer GLc over the two signal lines 41a and 41b and the three ground lines 41c to 41e. The ground strengthening line 441 is connected to the three ground lines 41c to 41e in the global wiring layer GLb through the via V, thereby the three ground lines 41c to 41e are connected. As a result, the impedance of each of the first to third ground wires 41c to 41e can be as low as possible.

Similarly, the ground strengthening line 442 is provided at a position close to the second port P2. The ground strengthening line 442 is configured in the uppermost global wiring layer GLc over the two signal lines 42a and 42b and the three ground lines 42c to 42e. The ground strengthening line 442 is connected to the three ground lines 42c to 42e in the global wiring layer GLb through the via V, whereby the three ground lines 42c to 42e are connected. As a result, the impedance of each of the first to third ground wires 42c to 42e can be as low as possible.

Similarly, the ground strengthening line 443 is provided close to the third port P3. The ground strengthening line 443 is configured in the uppermost global wiring layer GLc over the two signal lines 43a and 43b and the three ground lines 43c to 43e. The ground strengthening line 443 is connected to the three ground lines 43c to 43e in the global wiring layer GLb through the via V, whereby the three ground lines 43c to 43e are connected. As a result, the impedance of each of the first to third ground wires 43c to 43e can be as low as possible. In the example of FIG. 5A, the three ground strengthening lines 441, 442, and 443 are arranged, but the wiring width may be increased or the number of ground strengthening lines may be increased, if necessary. However, since it is a circuit that handles high frequency signals, it is necessary to be careful about the generation of parasitic components due to capacitive coupling with signal lines.

The first signal line 41a and the second signal line 41b of the first port P1 are parallel to the first ground line 41c and the third ground line 41e in the direction from the first port P1 to the second port P2. The first signal line 42a and the second signal line 42b of the second port P2 are parallel to the first ground line 42c and the third ground line 42e in the direction from the second port P2 to the first port P1.

The first signal line 41a, the wiring 46a, and the first signal line 42a are arranged between the first port P1 and the second port P2. The series connection switch S1a is arranged between the first signal line 41a and the wiring 46a. The series connection switch S2a is arranged between the wiring 46a and the first signal line 42a. In other words, the first signal line 41a of the first port P1 is connected to the first signal line 42a of the second port P2 via the two series connection switches S1a and S2a.

Further, the second signal line 41b, the wiring 46b, and the second signal line 42b are arranged between the first port P1 and the second port P2. The series connection switch S1b is arranged between the second signal line 41b and the wiring 46a, and the series connection switch S2b is arranged between the wiring 46b and the second signal line 42b. In other words, the second signal line 41b of the first port P1 is connected to the second signal line 42b of the second port P2 through the two series connection switches S1b and S2b.

On the side of the first port P1 of the series connection switches S1a and S1b, the parallel connection switch S1 is arranged between the node N1a of the first signal line 41a and the node N1b of the second signal line 41b. On the side of the second port P2 of the series connection switches S2a and S2b, the parallel connection switch S2 is arranged between the node N2a of the first signal line 42a and the node N2b of the second signal line 42b.

Each of the first signal lines 41a and 42a, the second signal lines 41b and 41b, and the wirings 46a and 46b is contacted to each of the node of the switches S1a, S2a, S1b, S2b, S1 and S2 through the global wiring layer GLb used for the coplanar waveguide 150, the plurality of vias GVa and LVn to LV1, the global wiring layer GLa, and the local wiring layer LLn to LL1 (see FIG. 5B).

The positive phase signal line Li1a is a signal line extending from the first signal line 41a to the coupling node N3a through the wiring 46a. The positive phase signal line Li2a is a signal line extending from the first signal line 42a to the coupling node N3a through the wiring 46a. The positive phase signal line Li3a is a signal line extending from the first signal line 43a to the coupling node N3a through the via V, the connection line 47, and the wiring 46a.

Further, the reverse phase signal line Li1b is a signal line extending from the second signal line 41b to the coupling node N3b through the wiring 46b. Further, the reverse phase signal line Li2b is a signal line extending from the second signal line 42b to the coupling node N3b through the wiring 46b. Further, the reverse phase signal line Li3b is a signal line extending from the second signal line 43b to the coupling node N3a through the wiring 46b.

The inductor L1a is arranged close to one throw terminal T1a of the first port P1. The inductor L1a connects the connection node N1a of the first signal line 41a and the first ground line 41c. The inductor L1a shown in the drawing has one winding, but it may be wound a plurality of times. In this case, the inductance can be increased.

The connection line 451a is wired under the first ground line 41c in the global wiring layer GLa. The wiring of the inductor L1a in the global wiring layer GLb and the connection line 451a are in contact with each other using the via V. The outer circumference of the inductor L1a is surrounded by the first ground wire 41c. As a result, the ground potential can be strengthened, and the isolation with respect to the elements of other blocks arranged around the high frequency switch 3 can be improved.

The inductor L1b is arranged close to the other throw terminal T1b of the first port P1. The inductor L1b connects the connection node N2a of the second signal line 41b and the third ground line 41e. The inductor L1b shown in the drawing has one winding, but it may be wound a plurality of times. In this case, the inductance can be increased.

The connection line 451b is wired under the third ground line 41c in the global wiring layer GLa. The wiring of the inductor L1b in the global wiring layer GLb and the connection line 451b are in contact with each other using the via V.

The outer circumference of the inductor L1b is surrounded by the third ground wire 41e. As a result, the ground potential can be strengthened, and the isolation with respect to the elements of other blocks arranged around the high frequency switch 3 can be improved.

The inductor L2a is arranged close to one throw terminal T2a of the second port P2. The inductor L2a connects the connection node N2a of the first signal line 42a and the first ground line 42c. The inductor L2a shown in the drawing has one winding, but it may be wound a plurality of times. In this case, the inductance can be increased.

The connection line 452a is wired under the first ground line 42c in the global wiring layer GLa. The wiring of the inductor L2a in the global wiring layer GLb and the connection line 452a are in contact with each other using the via V. The outer circumference of the inductor L2a is surrounded by the first ground wire 42c. As a result, the ground potential can be strengthened, and the isolation with respect to the elements of other blocks arranged around the high frequency switch 3 can be improved.

The inductor L2b is arranged close to the other throw terminal T2b of the first port P2. The inductor L2b connects the connection node N2b of the second signal line 42b and the third ground line 42e. The inductor L2b shown in drawing has one winding, but it may be wound a plurality of times. In this case, the inductance can be increased.

The connection line 452b is wired under the third ground line 42e in the global wiring layer GLa. The wiring of the inductor L2b in the global wiring layer GLb and the connection line 452b are in contact with each other using the via V. The outer circumference of the inductor L2b is surrounded by a third ground wire 42e. As a result, the ground potential can be strengthened, and the isolation with respect to the elements of other blocks arranged around the high frequency switch 3 can be improved.

These inductors L1a, L1b, L2a, and L2b may have the same self-inductance by causing their sizes, that is, the line widths and the line lengths to be equal to each other. Thereby, it is possible to approximate the frequency dependence of various characteristics related to the first port P1 and the second port P2, for example, insertion loss, return loss, or the like, which is transmission characteristic.

The wirings 46a and 46b branches into a T shape at the intermediate nodes N3a and N3b, respectively.

The wiring 46a extends from the node N3a to the side of the third port P3. This extending portion is connected to the first signal line 43a using the connection line 47 and the via V. The connection line 47 is arranged in the global wiring layer GLa, and is connected to the first signal line 43a under the wiring 46b arranged in the global wiring layer GLb.

The wiring 46b extends from the node N3b to the side of the third port P3. This extending portion is connected to the second signal line 43b.

The high frequency switch 3 is configured as described above. In this high frequency switch 3, impedance matching can be achieved by the inductors L1a, L1b, L2a, L2b and the off capacitance Coff of the switch SWa or SWb. Thus, high frequency characteristics can be improved.

The operation of the above-described configuration will be described. As shown in FIG. 3, it is assumed that the series connection switches S1a and S1b are on, the parallel connection switch S1 is off, the series connection switches S2a and S2b are off, and the parallel switch S2 is on. In this control state, high frequency signals can be transmitted between the first port P1 and the third port P3, and high frequency signal is not transmitted between the first port P1 and the second port P2 and between the second port P2 and the third port P3. In this control state, when a high frequency signal is input to the second port P2, most of the input power is reflected.

FIGS. 6A to 6F show the simulation results of the return loss characteristic of each of the ports P1 to P3 in the high frequency switch 3, the insertion loss characteristic and the isolation characteristic between the ports P1 to P3. In this case, the simulation is executed under the condition shown in FIG. 3. It is desirable that the input signal of the first port P1 is transmitted to the third port P3 without loss. It is also desirable that the input signal of the second port P2 is reflected to the first port P1 or third port P3 without leaking.

Figure 6A:
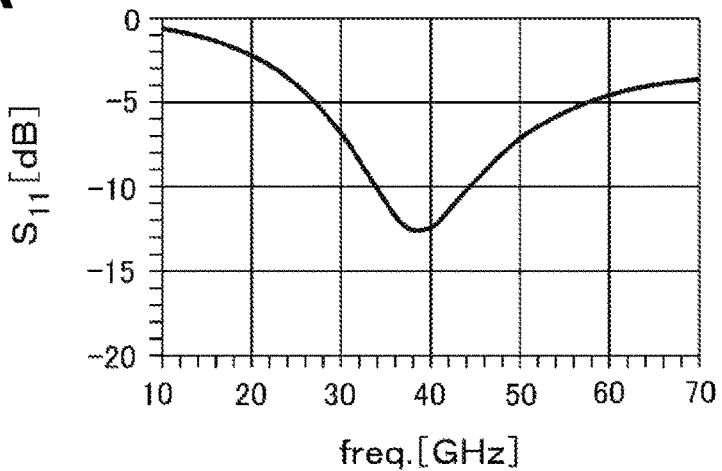
FIG. 6A is a diagram showing a return loss characteristic $S_{11}$ of a first port.
Figure 6B:
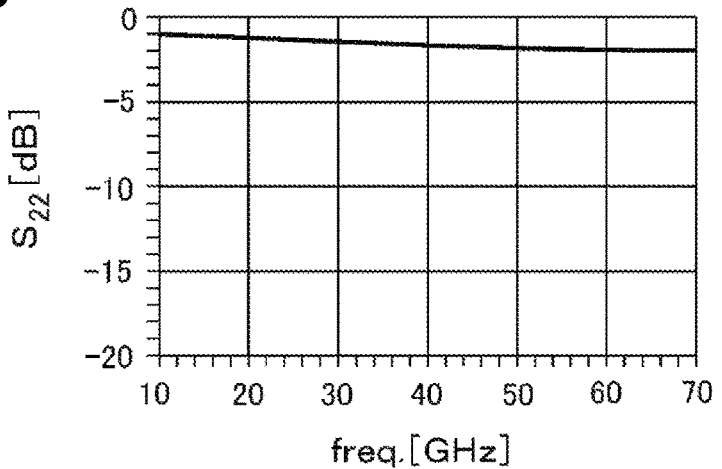
FIG. 6B is a diagram showing a return loss characteristic $S_{22}$ of a second port.
Figure 6C:
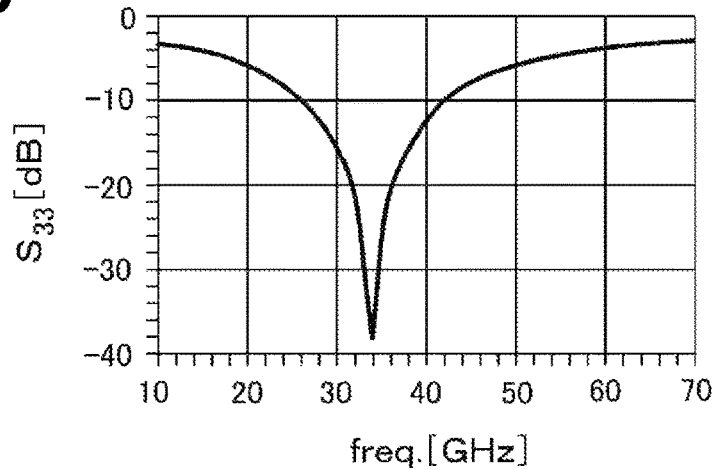
FIG. 6C is a diagram showing a return loss characteristic $S_{33}$ of a third port.

FIG. 6A shows the return loss characteristic $S_{11}$ at the first port P1, FIG. 6B shows the return loss characteristic $S_{22}$ at the second port P2, and FIG. 6C shows the return loss characteristic $S_{33}$ at the third port P3. Further, FIG. 6D shows the isolation characteristic $S_{12}$ from the second port P2 to the first port P1, FIG. 6E shows the insertion loss characteristic $S_{13}$ from the third port P3 to the first port P1, and FIG. 6F shows the isolation characteristic $S_{23}$ from the third port P3 to the second port P2.

As shown in FIGS. 6A and 6C, $S_{11}$ and $S_{33}$ that indicate the return loss characteristics of the first port P1 and the third port P3 can appropriately secure a bandwidth of less than −10 dB in the peripheral band of 38 GHz. Further, as shown in FIG. 6B, in the second port P2, signal is reflected in the entire band. Further, as shown in FIG. 6E, the insertion loss characteristic $S_{13}$ is obtained as −2.5 dB.

Figure 6D:
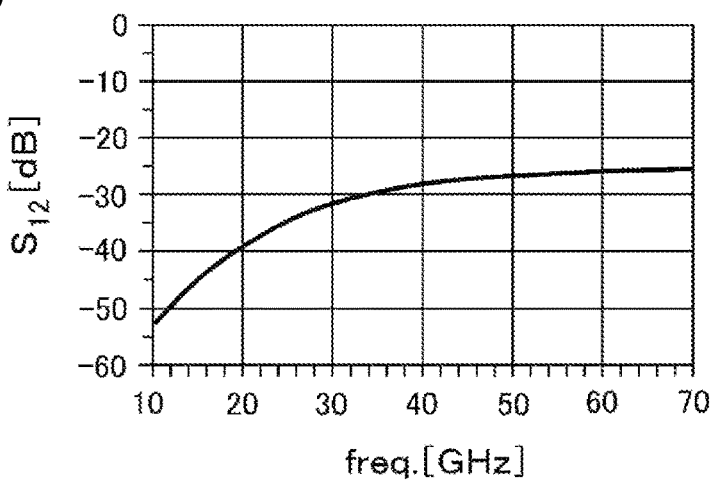
FIG. 6D is a diagram showing an isolation characteristic $S_{12}$ between the first port and the second port.
Figure 6E:
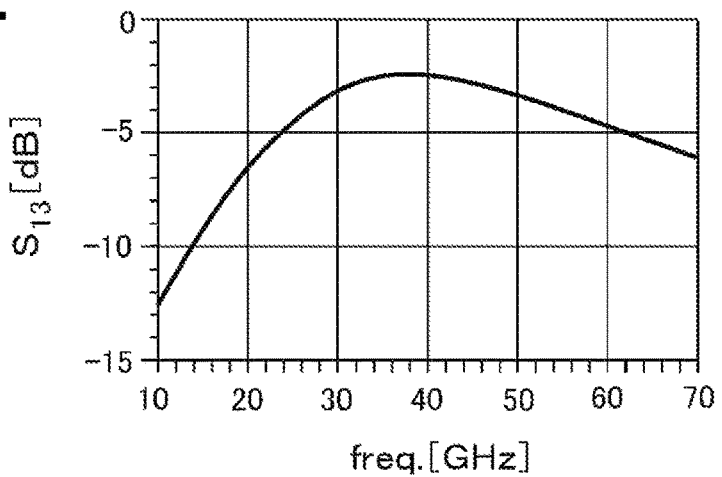
FIG. 6E is a diagram showing an insertion loss characteristic $S_{13}$ between the first port and the third port.
Figure 6F:
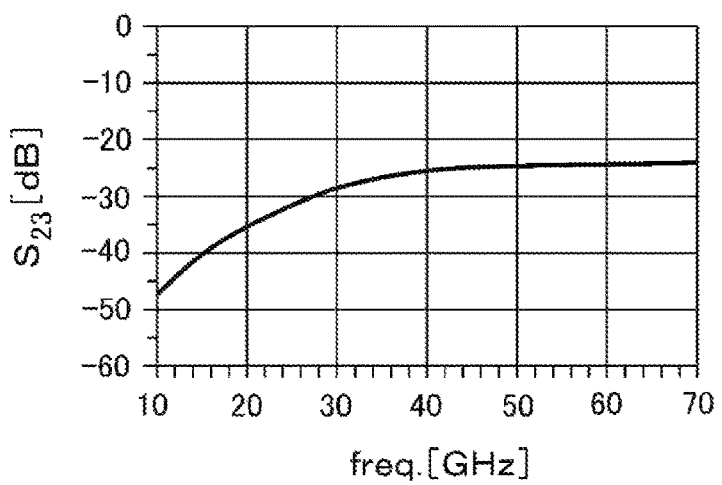
FIG. 6F is a diagram showing an isolation characteristic $S_{23}$ between the second port and the third port.

Further, as shown in FIGS. 6D and 6F, the isolation characteristics $S_{12}$ and $S_{32}$ (=$S_{23}$) with respect to the off-port second port P2 ensure −20 dB or less in the entire band. Thus, the characteristics of the high frequency switch 3 with low insertion loss and high isolation can be obtained.

This design is shown as an example, and if necessary, the gate width of the MOSFET M1 or the MOSFETs M11 to M1k constituting each switch SWa and SWb, the number of constituent stages of the MOSFET M1 or the MOSFETs M11 to M1k, and the size of the element value of the inductor L1a, L1b, L2a, and L2b may be adjusted. It should be noted that the high frequency characteristics fluctuate.

In the high frequency switch 3 of the present embodiment, the inductor L1a is connected between the throw terminal T1a and the ground G, the inductor L1b is connected between the throw terminal T1b and the ground G, the inductor L2a is connected between the throw terminal T2a and the ground G, the inductor L2b is connected between the throw terminal T2b and the ground G, and the inductors L1a, L1b, L2a, and L2b are connected in parallel. The parallel connection switch S1 is connected between the throw terminal T1a and the throw terminal T1b. The parallel connection switch S2 is connected between the throw terminal T2a and the throw terminal T2b. Further, the series connection switch S1a is connected is connected between the throw terminal T1a and the pole terminal T3a, and the series connection switch S1b is connected is connected between the throw terminal T1b and the pole terminal T3b. Further, the series connection switch S2a is connected is connected between the throw terminal T2a and the pole terminal T3a, and the series connection switch S2b is connected is connected between the throw terminal T2b and the pole terminal T3b.

With this configuration, the insertion loss in the millimeter wave band of 30 GHz or higher can be reduced to 3 dB or less. That is, the configuration can have less insertion loss than the insertion loss of a general Wilkinson power distributor. For example, when the characteristic impedances $Z_0$ at the three ports P1, P2, and P3 in a general T-shaped junction are equal, reflection occurs at the branch point. Therefore, the insertion loss (passing characteristic) when distributed evenly is deteriorated from 3.0 dB to about 3.6 dB. On the other hand, according to the high frequency switch 3 of the present embodiment, the insertion loss can be reduced to about 2.5 dB in the vicinity of 38 GHz in the predetermined frequency band to be used.

As a comparison configuration, a high frequency buffer amplifier are provided before and after the branching point. When the buffer amplifier is used, the current consumption of this buffer amplifier is generated. On the other hand, the high frequency switch 3 of the present embodiment is constituted by the inductors L1a, L1b, L2a, and L2b, the passive element of the transmission line, and the transistor that operates for switching. The configuration of the present embodiment does not consume current other than the control circuit corresponding to the digital unit 9a or 9b. Therefore, the high frequency switch 3 in the present embodiment can reduce the power consumption as compared with the technique of the comparison configuration. From the viewpoint of layout area, when the buffer amplifier is used, a total of three buffer amplifier layout areas are required before and after the T-shaped junction. On the other hand, the high frequency switch 3 of the present embodiment does not require an amplifier for buffering. Therefore, the high frequency switch 3 can be downsized as compared with the technique of the comparison configuration.

Further, the high frequency switch 3 of the present embodiment does not require the $\lambda/4$ transmission line required for the configuration of the Wilkinson power distributor. Thus, the configuration can reduce the layout area.

Second Embodiment

Figure 7:
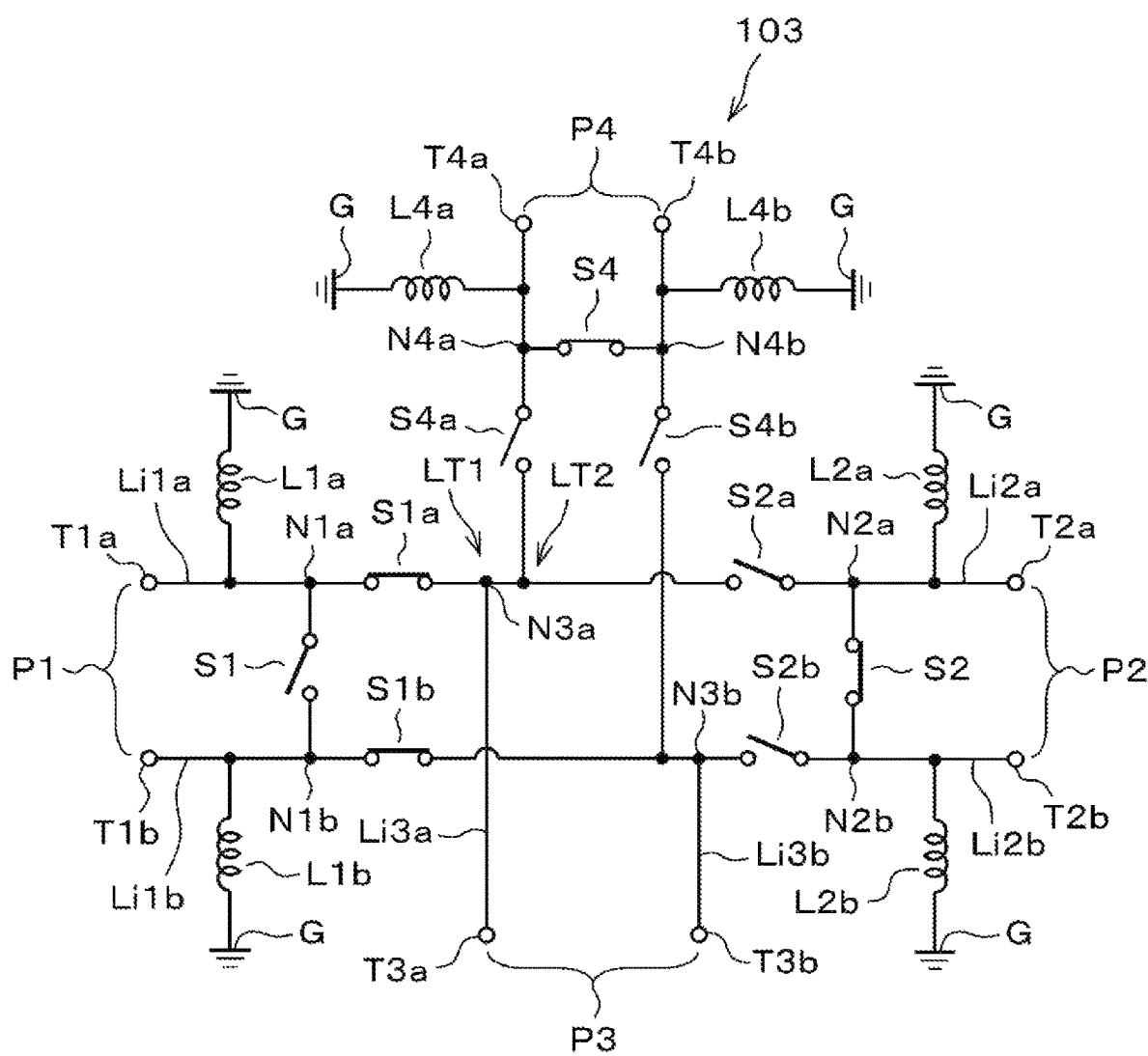
FIG. 7 is a circuit diagram showing a high frequency switch according to a second embodiment.

FIG. 7 shows an explanatory diagram of a second embodiment. In the configuration of FIG. 1 of the first embodiment, an example of the three port high frequency switch 3 is shown, but as shown in FIG. 7, the configuration can also be applied to a four port high frequency switch 103.

The high frequency switch 103 having four ports includes a fourth port P4 that has a pair of throw terminals T4a and T4b in addition to the configuration of the three port high frequency switch 3 described above. The high frequency switch 103 having four ports includes series connection switches S4a and S4b that execute control related to the input/output signals of the fourth port P4, a parallel connection switch S4, and inductors L4a and L4b.

The connection relationship between the series connection switches S4a and S4b, the parallel connection switch S4, and the inductors L4a and L4b related to the fourth port P4 corresponds to the connection relationship between the series connection switches S1a and S1b, the parallel connection switch S1, and the inductors L1a and L1b related to the first port P1 or the series connection switches S2a and S2b, the parallel connection switch S2, and the inductors L2a and L2b related to the second port P2. Thus, the description thereof will be omitted.

As a method of branching to each port, as shown in the circuit diagram of FIG. 7, two T-shaped branch paths LT1 and LT2 may be provided. Explaining with reference to the layout of FIG. 5A, on the layout, the fourth port P4 is provided opposite to the third port P3 with respect to the first signal lines 41a and 42a as the center. At this time, the T-shaped branch path LT1 corresponds to the above-mentioned T-shaped branch path LT, and includes lines branching from the nodes N3a and N3b. Further, the T-shaped branch path LT2 may be provided with a second coupling node at a position different from the coupling nodes N3a and N3b of the wirings 46a and 46b. The T-shaped branch path LT2 may include a line bent from the second branch node in the direction opposite to the side of the third port P3.

Further, a cross branch path may be provided instead of the T-shaped branch paths LT1 and LT2. Explaining with reference to the layout of FIG. 5A, this cross branch path includes lines bent from the coupling nodes N3a and N3b to the opposite direction to the third port P3 with respect to the first signal lines 41a and 42a.

In addition to the high frequency switch 3 of the first embodiment, the configuration can be applied to the high frequency switch 103 of Single Pole Triple Throw (SP3T) as shown in this embodiment. Although the description is omitted, the method of this embodiment can be applied to various high frequency switches such as Single Pole n Throw (SPnT, n is a natural number) in which the number of ports is further increased.

Third Embodiment

Figure 8:
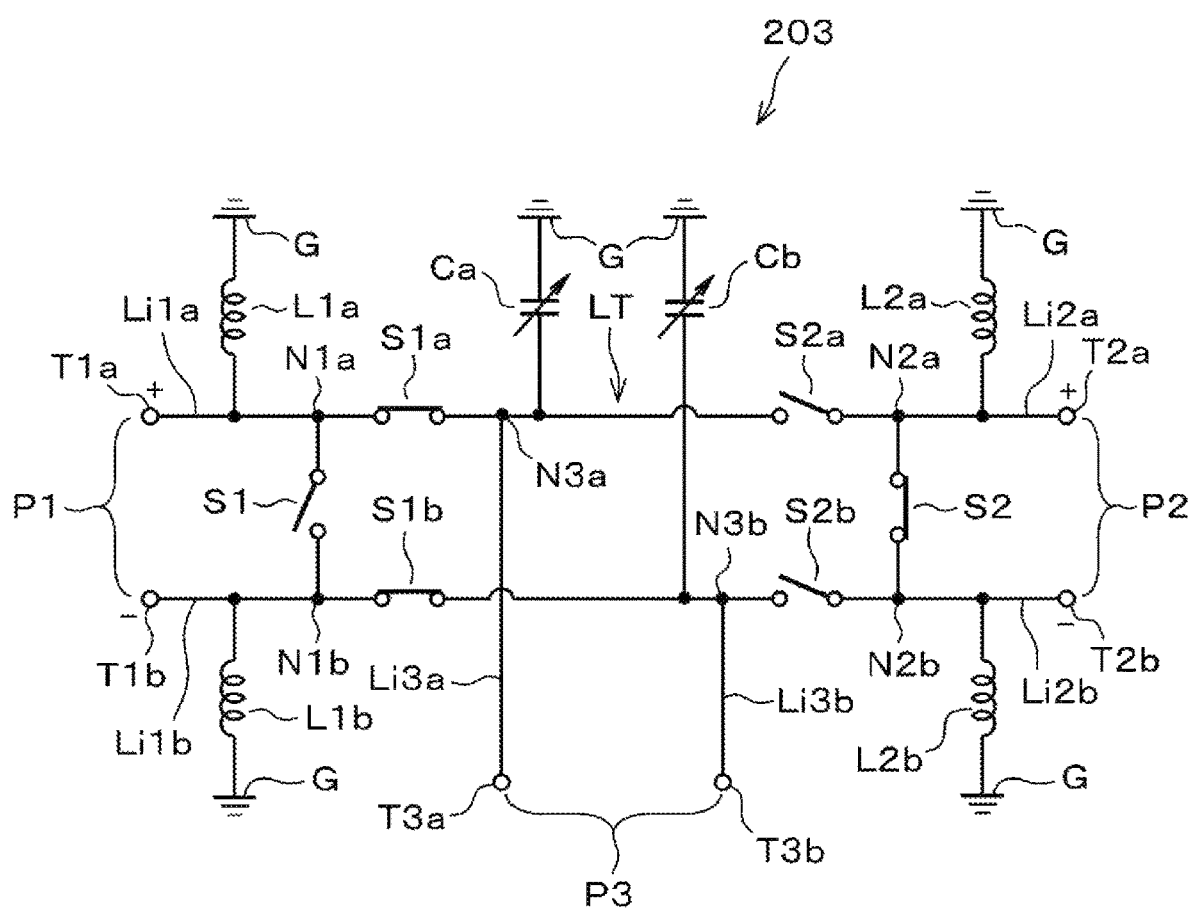
FIG. 8 is a circuit diagram showing a high frequency switch according to a third embodiment.
Figure 9A:
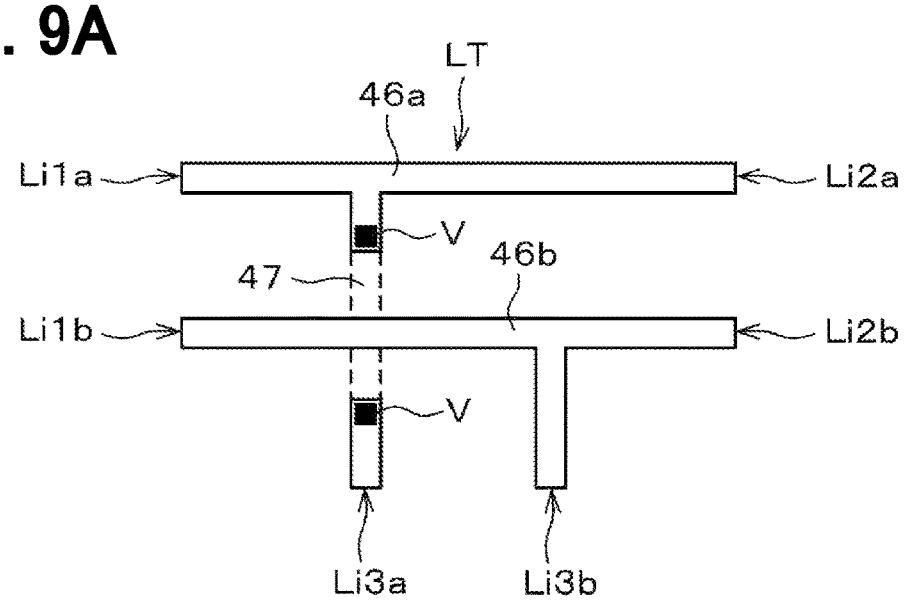
FIG. 9A is a first layout configuration diagram showing a T-shaped branch path.
Figure 9B:
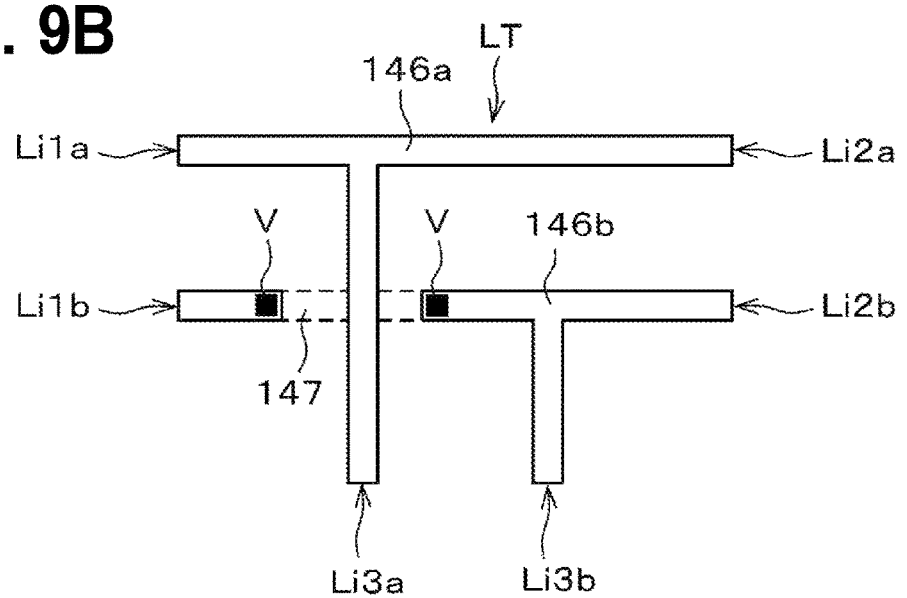
FIG. 9B is a second layout configuration diagram showing a T-shaped branch path.
Figure 9C:
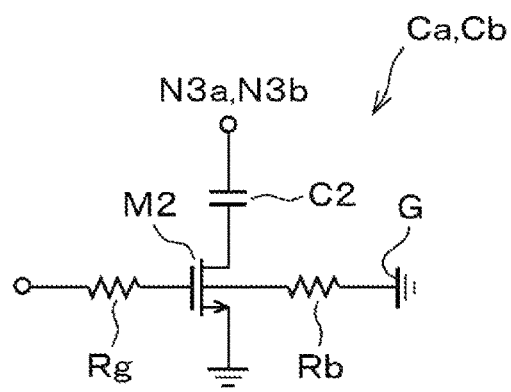
FIG. 9C is a circuit diagram showing a variable capacitance.

FIGS. 8 to 9C are explanatory views of a third embodiment. The third embodiment shows a configuration that corrects the amplitude difference and the phase difference between the positive phase signal line Li1a and the negative phase signal line Li1b of the first port P1 which occur when the second port P2 and the third port P3 are in the conductive state.

The third port P3 is arranged in a direction (downward in FIG. 3) bent with respect to the direction in which the first port P1 and the second port P2 are connected (left-right direction in FIG. 3). In this case, at the coupling nodes N3a and N3b that connect the throw terminals T1a-T2a of the first port P1 and the throw terminals T1b-T2b of the second port P2, it is necessary to extend the signal lines Li3a and Li3b to the third port P3.

In this case, as shown in the layout configuration of FIG. 5A, the path lengths of the transmission lines from the second port P2 to the third port P3 are different between the positive phase and the negative phase. For example, in the layout of FIG. 5A, the positive phase signal lines Li2a-Li3a from the second port P2 to the third port P3 pass from the first signal line 42a to the first signal line 43a through the node N3a of the wiring 46a.

As shown in the layout of FIG. 5A, the reverse phase signal lines Li2b-Li3b from the second port P2 to the third port P3 pass from the second signal line 42b to the second signal line 43b through the node N3b of the wiring 46b. At this time, since the third port P3 is arranged on the lower side in FIG. 5A, the path length from the first signal line 42a to the first signal line 43a is longer than the path length from the second signal line 42b to the second signal line 43b. This configuration causes a difference in the amplitude and phase of the high frequency signal.

More specifically, as shown in the millimeter wave radar system 1 of FIG. 1, when the local oscillation signal distribution amplifiers 13a and 13b and the phase shifters 18a and 18b are connected to the subsequent stage of the high frequency switch 3, the amplitude difference between the positive phase and the negative phase generated in the high frequency switch 3 is directly input and the amplitude difference may be transmitted to the subsequent stage. When an element such as a balun or the like, which corrects the imbalance between the positive and negative phases, is not provided in the local oscillation signal distribution amplifiers 13a and 13b in the following stage, different voltage amplitudes are applied to the positive and negative phases of the transistor that perform amplification.

In this case, the load on the transistor having the higher voltage amplitude becomes large. When this transistor is provided by a MOSFET or the like, it affects the reliability of Time Dependent Dielectric Breakdown (TDDB) and Hot Carrier Injection (HCI). Further, when impedance matching is performed by the local oscillation signal distribution amplifiers 13a and 13b in the subsequent stage by complex conjugate, which is the condition of maximum power supply, it is difficult to satisfy the optimum condition because the impedance differs between the positive phase and the negative phase of the transistor.

In such a case, the gate widths of the MOSFET M1 or the MOSFETs M11 to M1k constituting the series connection switches S1a, S1b, S2a, and S2b and the sizes of the inductors L1a, L1b, L2a, and L2b may be changed according to the difference of the path lengths between the positive phase and the negative phase. As a result, the influence of the difference in the path length can be suppressed, and imbalance of the amplitude difference and the phase difference between the positive phase signal and the negative phase signal can be reduced.

Further, FIG. 9A schematically shows the routes of the wirings 46a and 46b constituting the T-shaped branch path LT shown in FIG. 5A. In the layout configuration shown in FIG. 9A, the connection line 47 extends under the wiring 46b downward in FIG. 9A.

FIG. 9B schematically shows a modified example of the paths of the wirings 146a and 146b constituting the T-shaped branch path LT. In the layout configuration shown in FIG. 9B, the wiring 146a extends over the connection line 147 in an up to down direction in FIG. 9B. The connection line 147 is arranged in the global wiring layer GLa, and connects the reverse phase signal lines Li1b-Li2b using the via V under the wiring 146a configured in the global wiring layer GLb.

In both the structures of FIGS. 9A and 9B, as shown in FIG. 8, capacitances Ca and Cb may be provided between the positive phase signal line Li3a and the ground node G and between the negative phase signal line Li3b and the ground node in the T-shaped branch path LT, respectively. Each of the capacities Ca and Cb may have a variable capacity. By adjusting the values of the variable capacities Ca and Cb according to the case where the first port P1 and the third port P3 are in the conductive state and the case where the second port P2 and the third port P3 are in the conductive state, the imbalance between the positive phase and the negative phase can be reduced even in any of the conductive states.

As the variable capacitances Ca and Cb, the configuration shown in FIG. 9C may be used. As shown in FIG. 9C, each of the variable capacitances Ca and Cb includes a MOSFET M2 and a fixed capacitance C2 configured by a Metal Oxide Metal (MOM) capacitance or the like. The MOSFET M2 and the fixed capacitance C2 are connected in series between the coupling node N3a or N3b of the T-shaped branch path LT and the ground node G. By turning MOSFET M2 on/off by a logic circuit not shown in drawings, the capacitance value between the coupling node N3a or N3b and the ground node G can be changed.

The capacitance value between the coupling node N3a or N3b and the ground node G is the combined capacitance value of the fixed capacitance C2 and the source/drain capacitance of the MOSFET M2.

It is assumed that the on/off states of the series connection switches S1a, S1b, S2a, and S2b and the parallel connection switches S1 and S2 are controlled, and the second port P2 and the third port P3 are caused to be in the conductive state. In this case, the capacitance value of the variable capacitance Ca connected to the positive phase signal line Li3a is reduced and the capacitance value of the variable capacitance Cb connected to the negative phase signal line Li3b is set to be larger than the variable capacitance Ca such that the amplitude difference between the phase signal and the reverse phase signal can be reduced in the port P3. By adjusting the capacitance values of the variable capacitances Ca and Cb as described above, the amplitude difference and the phase difference between the positive phase signal and the negative phase signal in the third port P3 can be reduced.

When the first port P1 and the third port P3 are to be in the conductive state, the difference in line length between the positive phase and the negative phase is almost negligible with respect to the electrical length of the signal.

Therefore, the capacitance value of the variable capacitance Ca connected to the positive phase signal line Li3a and the capacitance value of the variable capacitance Cb connected to the negative phase signal line Li3b are adjusted to be the same.

As described above, by adjusting the capacitance values of the variable amplitudes Ca and Cb according to each operating state, even when the second port P2 and the third port P3 are in the conductive state, and the first port P1 and the third port P3 are in the conductive state, the amplitude difference and the phase difference generated between the positive phase signal and the negative phase signal can be reduced.

Fourth Embodiment

Figure 10:
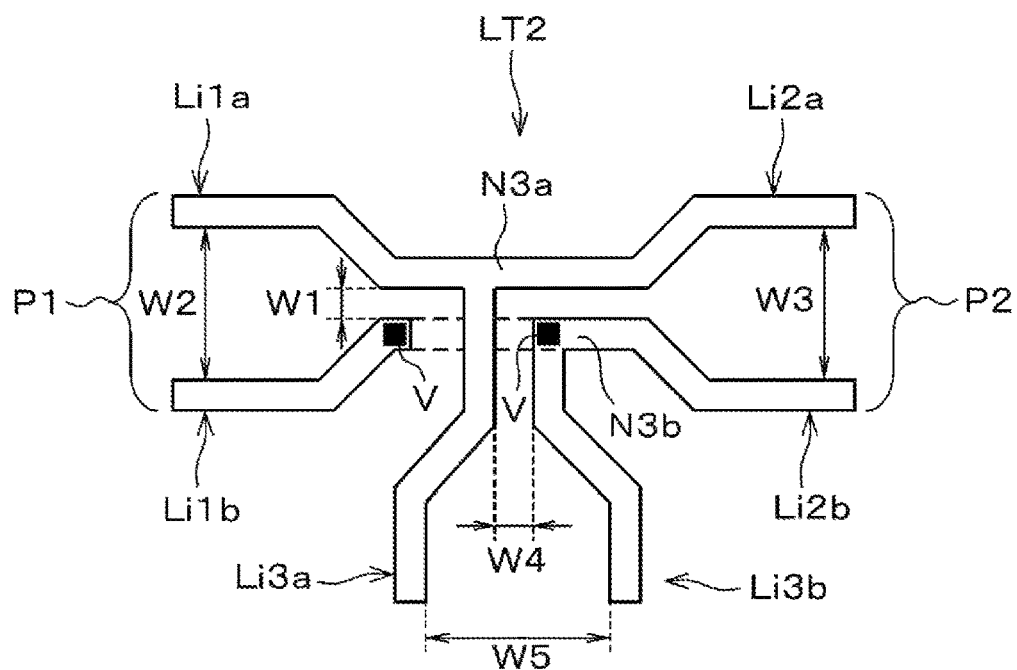
FIG. 10 is a third layout configuration diagram showing a T-shaped branch path according to a fourth embodiment.

FIG. 10 shows a specific layout structure of the T-shaped branch path LT2 in the vicinity of the coupling nodes N3a and N3b, which replaces the structure of FIG. 9A or FIG. 9B. As shown in FIG. 10, in the T-shaped branch path LT2, the line interval W1 between the positive and negative phase signal lines Li1a-Li1b at the coupling nodes N3a and N3b is narrower than the line interval W2 between the positive and negative phase signal lines Li1a-Li1b at the beginning of extension. The line interval W1 between the positive and negative phase signal lines Li2a-Li2b at the coupling nodes N3a and N3b is narrower than the line interval W3 between the positive and negative phase signal lines Li2a-Li2b at the beginning of extension.

The line interval W4 between the positive and negative phase signal lines Li3a-Li3b at the coupling nodes N3a and N3b is narrower than the line interval W5 between the positive and negative phase signal lines Li3a-Li3b at the beginning of extension. With the layout shown in FIG. 10 as described above, the configuration can reduce the difference in the path length between the outer loop path and the inner loop path even when the second port P2 and the third port P3 are in the conductive state. As a result, the amplitude difference and the phase difference can be reduced.

The variable capacities Ca and Cb shown in the above-described embodiment may or may not be further provided. Further, the line interval W2 at the first port P1, the line interval W3 at the second port P2, and the line interval W5 at the third port P3 may be equal because the characteristic impedance Z0 at each port P1 to P3 is equal. However, the line interval W2, the line interval W3, and the line interval W5 may be different depending on the required characteristic impedance Z0 in each port P1 to P3. Similarly, the line interval W1 and the line interval W4 may or may not be the same from the same viewpoint.

Fifth Embodiment

Figure 11:
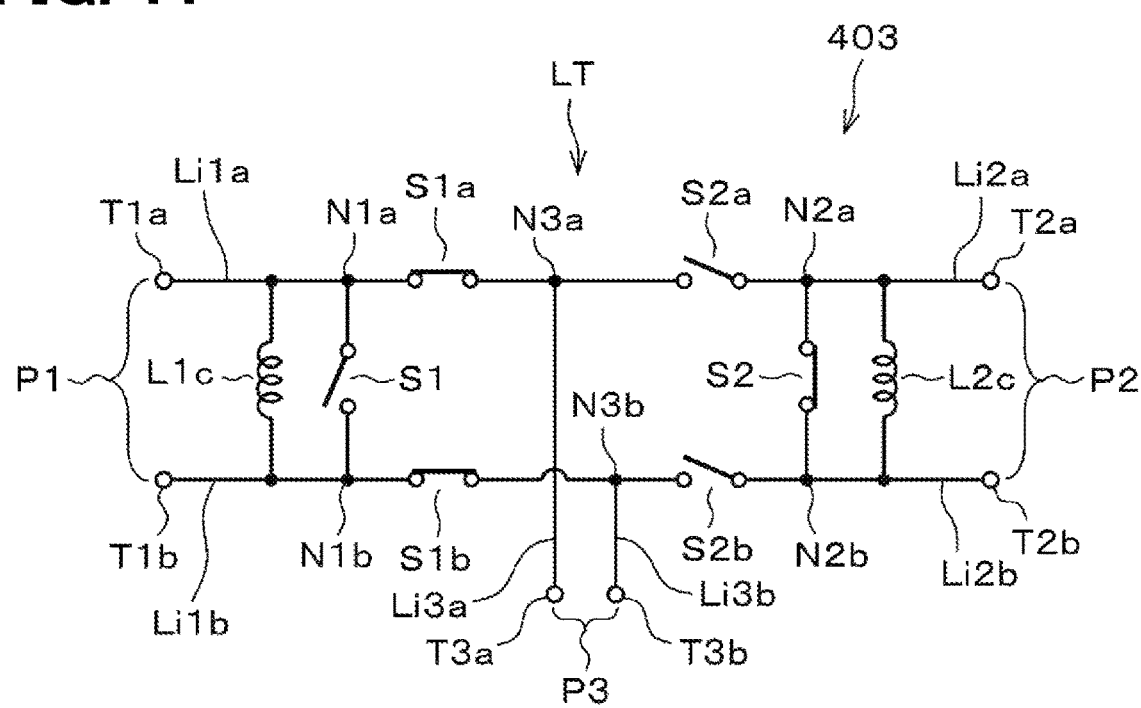
FIG. 11 is a circuit diagram showing a high frequency switch according to a fifth embodiment.

FIG. 11 shows a circuit diagram of a high frequency switch 403 according to a fifth embodiment. As shown in FIG. 11, in the fifth embodiment, inductors L1c and L2c, which are respectively referred to as a first inductor L1c and a second inductor L2c, having a differential configuration are connected between the throw terminals T1a-T1b of the first port P1 and the throw terminals T2a-T2b of the second port P2.

The high frequency switch 403 can reduce the number of inductors. Therefore, the occupied area of the inductors can be reduced, and the layout area can be reduced. In addition, in the fifth embodiment, since the inductors L1c and L2c are inserted between the differential signal lines, the influence of the parasitic component can be reduced.

Sixth Embodiment

Figure 12:
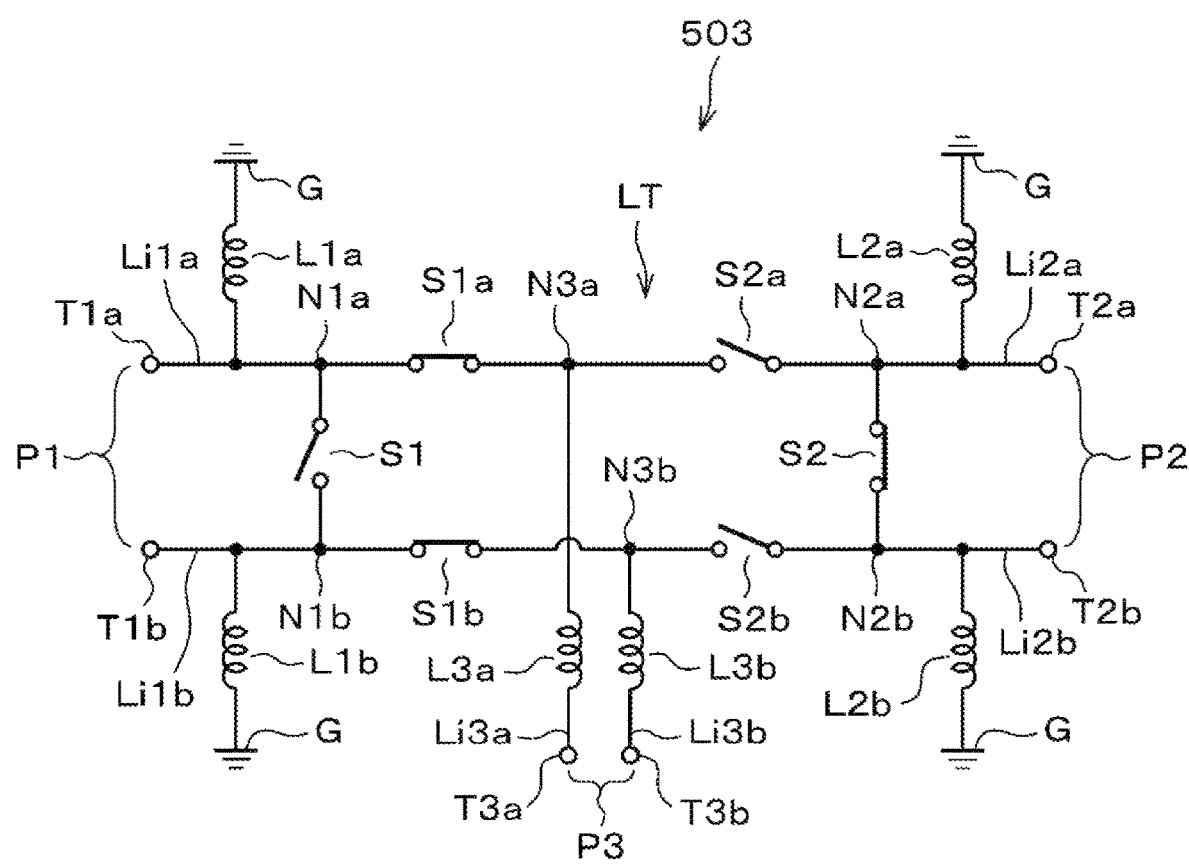
FIG. 12 is a circuit diagram showing a high frequency switch according to a sixth embodiment.

FIG. 12 shows a circuit diagram of a high frequency switch 503 according to a sixth embodiment. In the sixth embodiment, another inductor L3a is connected to the signal lines Li3a of the pole terminal T3a, and another inductor L3b is connected to the signal lines Li3b of the pole terminal T3b.

Compared with the circuit configuration and layout configuration related to the first port P1 and the second port P2, the circuit configuration and layout configuration related to the third port P3 do not have a symmetrical structure.

In the sixth embodiment, the return loss characteristic $S_{33}$ at the third port P3 can be improved by respectively connecting the inductors L3a and L3b in series with the pole terminals T3a and T3b of the third port P3.

Seventh Embodiment

Figure 13:
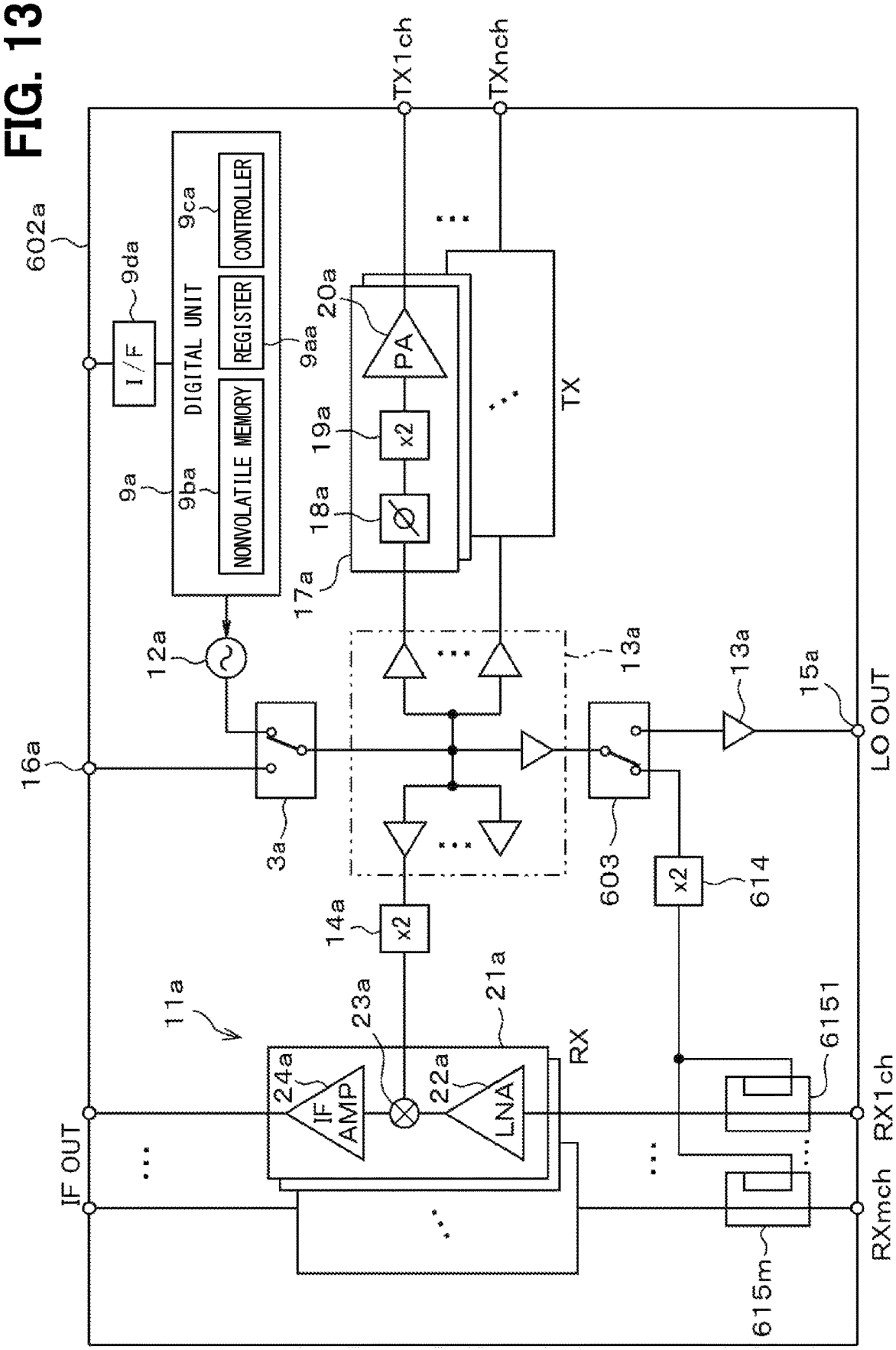
FIG. 13 is a circuit diagram showing a master integrated circuit according to a seventh embodiment.

FIG. 13 shows an explanatory diagram of a seventh embodiment. As shown in FIG. 13, a Built-In-Self Test (BIST) function for a high frequency circuit can be provided by providing a path for transmitting a local oscillation signal inside the integrated circuit 2 to a receiver 21a. The BIST function is provided for reducing the cost required for the high frequency test at the time of shipment or after shipment. The BIST function verifies the circuit operation by inputting the internally generated high frequency signal to each circuit block.

Since the configuration of the master integrated circuit 602a shown in FIG. 13 is similar to that of the first embodiment other than the BIST function, the configuration and description of the controller 4 will be omitted.

The master integrated circuit 602a, which replaces the master integrated circuit 2a, includes the similar configuration to the master integrated circuit 2a described in the first embodiment, and includes a high frequency switch 603, a frequency doubler 614, and a couplers 6151 to 615m in the following stage of the local oscillation signal distribution amplifier 13a.

One output port of the high frequency switch 603 is configured as the first port P1 and is connected to the local oscillation signal output port 15a for transmitting the local oscillation signal to the outside. The other output port of the high frequency switch 603 is configured as the second port P2 and is connected to couplers 6151 to 615m via a frequency doubler 614. Each of the couplers 6151 to 615m transmits the local oscillation signal generated by the internal PLL 12a to each reception channel RX1ch to RXmch of the receiver 21a as a test signal.

When the reception system circuit of the master integrated circuit 602a is self-diagnosed, the control unit 9ca switches the path from the input of the high frequency switch 3a to the PLL12a and switches the path from the output of the high frequency switch 603 to the frequency doubler 614 based on the parameter stored in the circuit control register 9aa.

By controlling the signal path inside the master integrated circuit 602a to the above state, the high frequency signal for self-diagnosis is input to each channel of the receiver 21a. On the other hand, the local oscillation signal is input to the mixer 23a of the receiver 21a through the frequency doubler 14a. By inspecting the output signal of the intermediate frequency amplifier 24a and the electrical characteristics of the internal node, a self-diagnosis test can be performed on the LNA 21a, the mixer 23a, and the intermediate frequency amplifier 24a inside the receiver 21a.

According to this embodiment, the high frequency switch 603 is used to input the local oscillation signal to the LNA 21a of the reception unit 11a during the self-diagnosis test. The configuration can perform a self-diagnosis test using the internal local oscillation signal.

Eighth Embodiment

Figure 14:
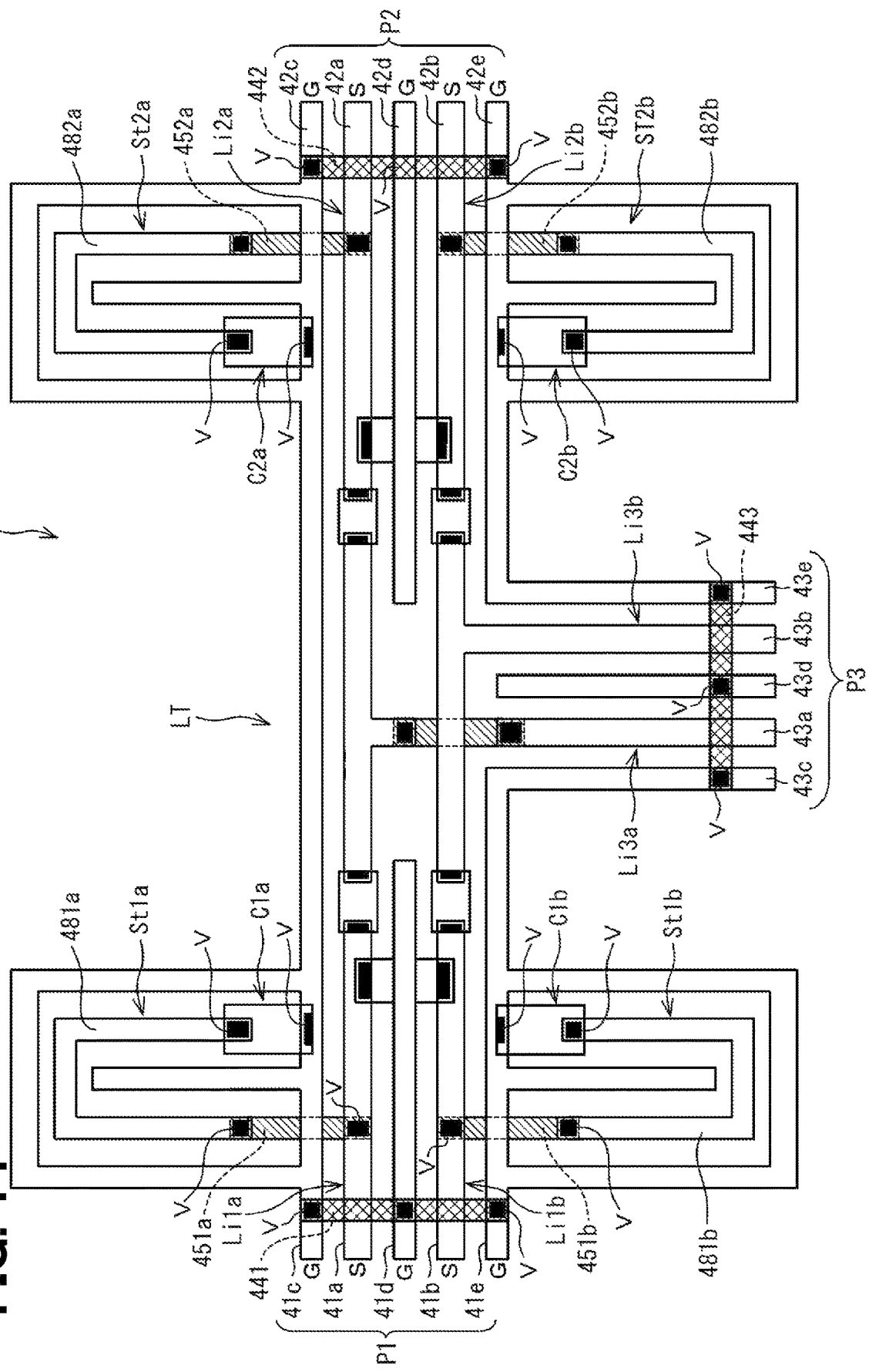
FIG. 14 is a layout diagram showing a high frequency switch according to an eighth embodiment.

The high frequency switch 703 shown in FIG. 14 is configured by using stubs St1a, St1b, St2a, and St2b instead of the inductors L1a, L1b, L2a, and L2b in the first embodiment. The similar structure in FIG. 5A is shown and the reference numerals are omitted.

The stub St1a connects the wiring 481a and the connection line 451a between the first signal line 41a and the first ground line 41c through the via V.

The stub St1a is configured by connecting a capacitive element C1a of MOM or Metal Insulator Metal (MIM) in series. The wiring 481a is grounded at a high frequency with respect to the ground wire 41c by connecting the capacitance element C1a.

As shown in FIG. 14, the structures of the other stubs St1b, St2a, and St2b are symmetrical with the stubs St1a, and their configurations and operating principles are the same. Therefore, the configuration description of the stubs St1b, St2a, and St2b will be omitted.

Further, the stubs St1a, St1b, St2a, and St2b shown in FIG. 14 are composed of coplanar waveguides having ground lines on both sides of the signal line, and are bent in the middle of the transmission line in order to reduce the layout area.

By configuring such stubs Stia, St1b, St2a, and St2b, it is possible to obtain the similar characteristics to the characteristics when the spiral inductors In1a, In1b, In2a, and In2b are used in terms of high frequency characteristics. The other configuration is similar to that of the first embodiment, and hence the description will be omitted.

Ninth Embodiment

FIGS. 15 to 20 show configuration examples of transmission lines 250, 350, 450, 550, 650, and 750 instead of the coplanar waveguide 150 shown in FIG. 5C in the first embodiment.

Figure 15:
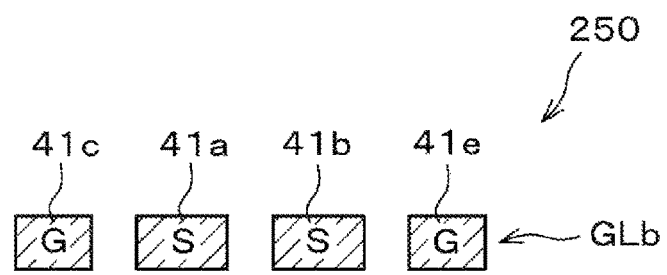
FIG. 15 is a first cross-sectional view showing a transmission line according to a ninth embodiment.

As shown in FIG. 15, a transmission line 250 may not provide the ground wire 41d in the center of the coplanar waveguide 150. That is, the pair of signal lines 41a and 41b may be adjacent to each other, and the ground lines 41c and 41e may be arranged apart from the pair of signal lines 41a and 41 b on both outer sides.

Figure 16:
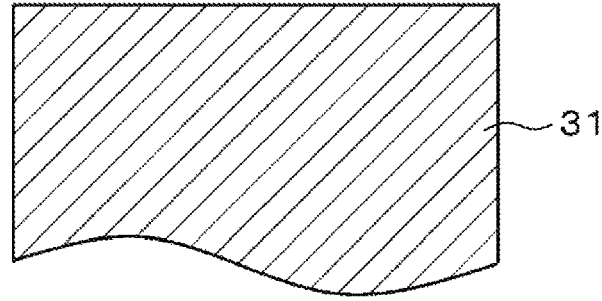
FIG. 16 is a second cross-sectional view showing a transmission line.

Further, as shown in FIG. 16, the transmission line 350 may not provide the ground lines 41c and 41e at both ends of the transmission line 250. In this case, the two signal lines 41a and 41 b are arranged above the silicon substrate 31, and the silicon substrate 31 functions as a ground potential.

Figure 17:
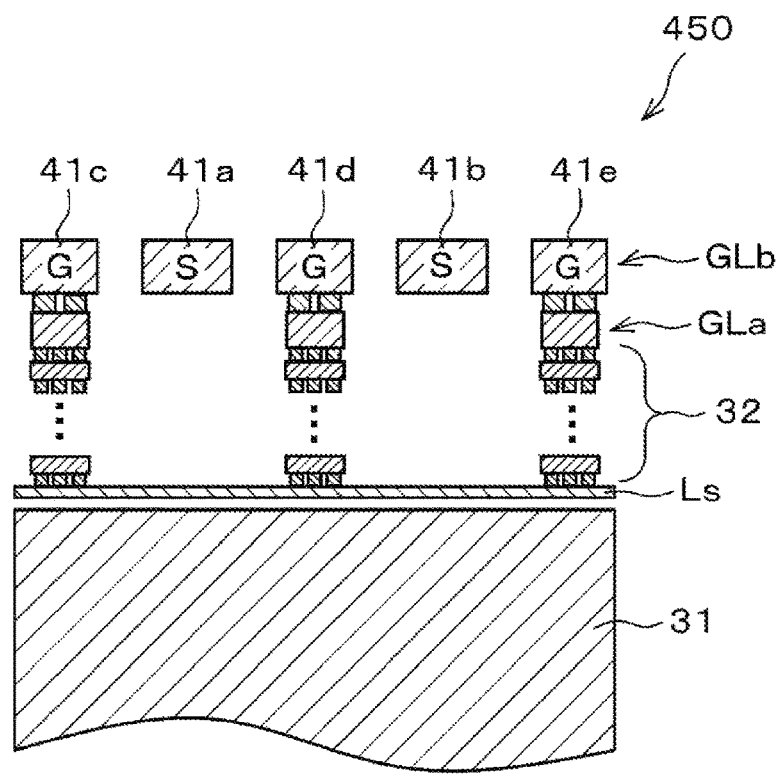
FIG. 17 is a third cross-sectional view showing a transmission line.

Further, as shown in the transmission line 450 of FIG. 17, a coplanar line with a ground shield layer Ls may be used. The transmission line 450 is provided with the ground shield layer Ls between the ground wires 41c to 41e and the silicon substrate 31. The ground shield layer Ls extends in parallel with the silicon substrate 31 between the ground wires 41c and 41e and the signal lines 41a and 41b and the silicon substrate 31, and is provided as a shield against the silicon substrate 31. The ground shield layer Ls connects each of the ground wires 41c to 41e through the global wiring layer GLb, another global wiring layer GLa, and the local wiring 32.

Figure 18:
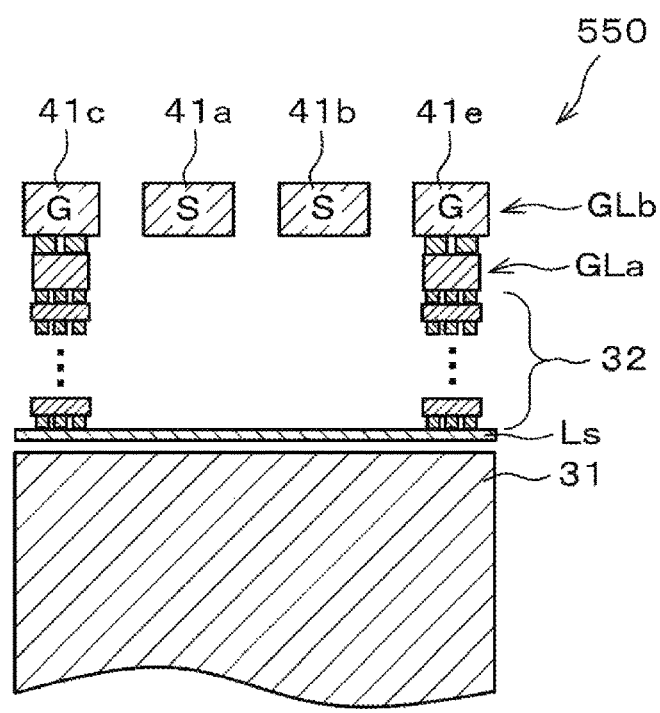
FIG. 18 is a fourth cross-sectional view showing a transmission line.

Similarly, as shown in the transmission line 550 of FIG. 18, a coplanar line with a ground shield layer Ls may be used. The transmission line 550 is provided with a ground shield layer Ls between the ground lines 41c and 41e at both ends and the silicon substrate 31 with respect to the coplanar line without the central ground line 41d shown in FIG. 15.

Figure 19:
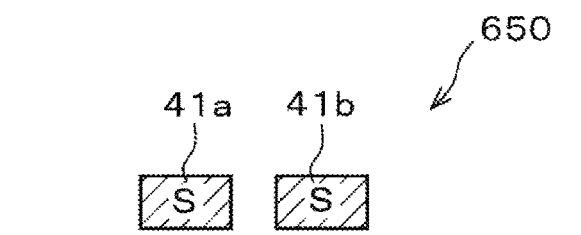
FIG. 19 is a fifth cross-sectional view showing a transmission line.
Figure 19:
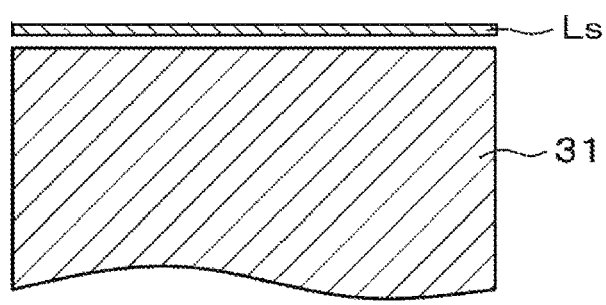

Further, as shown in the transmission line 650 of FIG. 19, a micro strip line with a ground shield layer Ls may be used. The transmission line 650 is provided with the ground shield layer Ls between the signal wires 41a and 41b and the silicon substrate 31. In the cross-sectional view of FIG. 19, the potential of the ground shield layer Ls appears to be in a floating state, but the ground shield layer Ls is connected to another ground potential node in the integrated circuit 602a.

Figure 20:
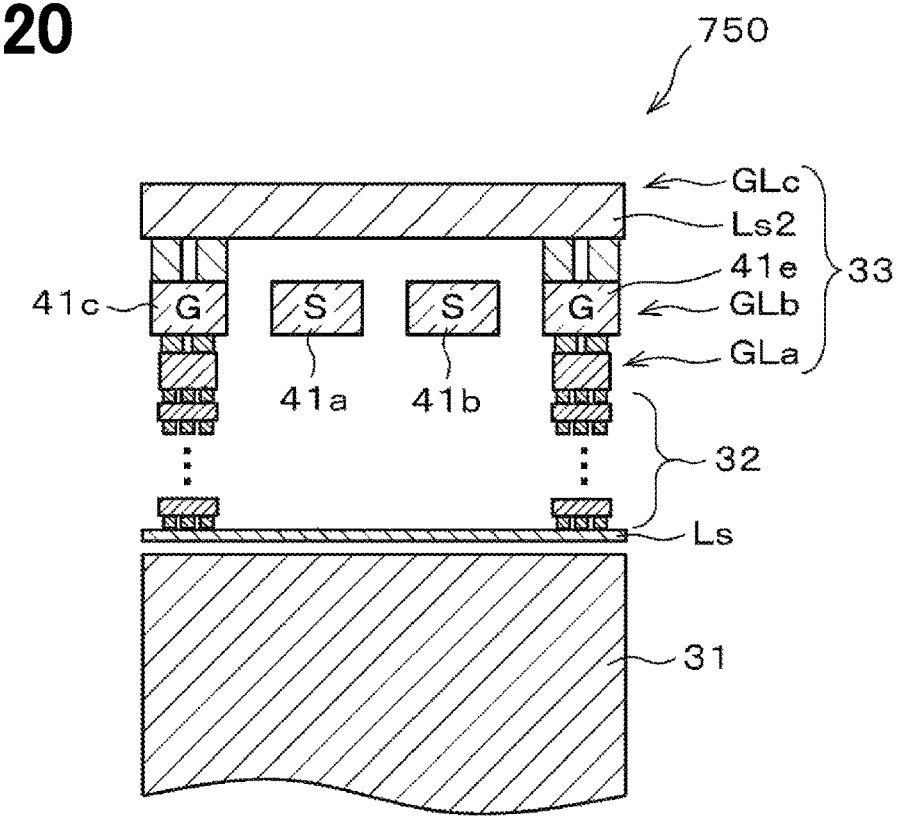
FIG. 20 is a sixth cross-sectional view showing a transmission line.

Further, as shown in the transmission line 750 of FIG. 20, a coplanar line with ground shield layers Ls and Ls2 may be used. The ground shield layer Ls2 is configured in the global wiring layer GLc located above the global wiring layer GLb.

The transmission line 750 is configured by sandwiching the signal line 41a vertically by the ground shield layers Ls and Ls2. In the transmission line 750 shown in FIG. 20, the ground line 41d is not provided at the center between the signal lines 41a and 41b, but the ground line 41d may be provided.

Regarding the transmission line shown in FIG. 5C of the first embodiment and the transmission line shown in FIGS. 15 and 20 of the sixth embodiment, the characteristic impedance $Z_0$ of the differential transmission line in the sufficiently high frequency region in the Odd mode is given by equation (1).

(Equation 1)

$$Z_0 = \sqrt{\frac{L_o}{2C_s + C_g}} \quad (1)$$

In this equation (1), Lo indicates an inductance component per unit length, Cg indicates a capacitance component for ground, and Cs indicates a capacitance component for signal line. Since the inductance component Lo, the ground capacitance component Cg, and the signal line capacitance component Cs change depending on the structure and size of the transmission line, the value of the characteristic impedance Z0 also changes.

Other Embodiments

The present disclosure should not be limited to the embodiments described above, and various modifications may further be implemented without departing from the gist of the present disclosure.

That is, two or more embodiments described above may be combined to implement the control of the present disclosure. A part of the above-described embodiment may be dispensed/dropped as long as the problem identified in the background is resolvable. In addition, various modifications of the present disclosure may be considered as encompassed in the present disclosure, as long as such modifications pertain to the gist of the present disclosure.

Although the present disclosure is described based on the above embodiments, the present disclosure is not limited to the disclosure of the embodiment and the structure. The present disclosure is intended to cover various modification examples and equivalents thereof. In addition, various modes/combinations, one or more elements added/subtracted thereto/therefrom, may also be considered as the present disclosure and understood as the technical thought thereof.

What is claimed is:

1. A high frequency switch configured to switch paths of differential signals arranged in an integrated circuit, the high frequency switch comprising:

a pair of pole terminals that constitute one port;

a plurality of pairs of throw terminals, each pair of throw terminals constituting another port;
a plurality of inductors each connected (i) between each throw terminal and a ground node or (ii) between the throw terminals of each pair, and the plurality of inductors being connected in parallel;
a plurality of parallel connection switches each connected between the throw terminals of each pair, and the plurality of parallel connection switches being connected in parallel; and
a plurality of series connection switches each connected between each throw terminal and a corresponding pole terminal,
wherein
each of the parallel connection switches and the series connection switches is configured by a single Metal-Oxide-Semiconductor Field Effect Transistor (MOSFET) or a plurality of stages of MOSFETs, and
the inductors are connected between a positive phase signal line and a negative phase signal line to which the plurality of pairs of throw terminals are connected.

2. The high frequency switch according to claim 1, wherein
the plurality of pairs of throw terminals are provided by two pairs of throw terminals, and
the high frequency switch is configured as a Single Pole Double Throw (SPDT) that includes the two pairs of throw terminals.

3. The high frequency switch according to claim 1, wherein
a gate width of the MOSFET of the parallel connection switch is same as a gate width of the MOSFET of the series connection switch, and
the inductors have a same structure as each other.

4. The high frequency switch according to claim 1, wherein
a gate width of the MOSFET of each series connection switch and a size of each inductor are set according to a phase difference between a positive phase and a negative phase.

5. The high frequency switch according to claim 4, wherein
the MOSFET of each of the parallel connection switches and the series connection switches has an off capacitance and each of the inductors has and an inductance, and
the off capacitance and the inductance cause a resonance frequency to be within a predetermined operating frequency band.

6. The high frequency switch according to claim 1, further comprising
coupling nodes each connects, by a signal line, each throw terminal and the corresponding pole terminal; and
variable capacitances each connected to each coupling node.

7. The high frequency switch according to claim 1, further comprising
coupling nodes, each of which connects, by a signal line, each throw terminal and the corresponding pole terminal, wherein
a line interval between a positive phase line and a negative phase line at the coupling nodes is narrower than a line interval between the positive phase line and the negative phase line at each pair of throw terminals, and
a line interval between a positive phase line and a negative phase line at the coupling nodes is narrower than a line interval between the positive phase line and the negative phase line at the pair of pole terminals.

8. The high frequency switch according to claim 1, wherein
each of the parallel connection switches is configured by a plurality of stages of transistors connected in series.

9. The high frequency switch according to claim 8, wherein
each of the series connection switches is configured by a single transistor or a plurality of stages of transistors, and
a number of stages in each of the parallel connection switches is greater than a number of stages in each of the series connection switches.

10. The high frequency switch according to claim 1, further comprising
other inductors each connected to each pole terminals.

11. The high frequency switch according to claim 1, wherein
the high frequency switch switches an output of a Phase Locked Loop (PLL) configured inside the integrated circuit to an inside or an outside of the integrated circuit.

12. The high frequency switch according to claim 1, wherein
the high frequency switch transmits, during a self-diagnosis test, a high frequency signal to a receiver.

13. The high frequency switch according to claim 1, wherein
the inductors are provided such that a resonance frequency determined based on a combined capacitance of capacitances of the parallel connection switches and the series connection switches and inductance values of the inductors is to be corrected.

14. A high frequency switch configured to switch paths of differential signal arranged in an integrated circuit, the high frequency switch comprising:
a first pole port including a first pole terminal and a second pole terminal;
a first throw port including a first throw terminal and a second throw terminal;
a second throw port including a third throw terminal and a fourth throw terminal;
inductors including:
(i) a first inductor connecting the first throw terminal and the second throw terminal, and
(ii) a second inductor connecting the third throw terminal and the fourth throw terminal; and
parallel connection switches including:
(i) a first parallel connection switch connecting the first throw terminal and the second throw terminal, and
(ii) a second parallel connection switch connecting the third throw terminal and the fourth throw terminal; and
series connection switches including:
(i) a first series connection switch connecting the first throw terminal and the first pole terminal,
(ii) a second series connection switch connecting the second throw terminal and the second pole terminal,
(iii) a third series connection switch connecting the third throw terminal and the first pole terminal, and
(iv) a fourth series connection switch connecting the fourth throw terminal and the second pole terminal.

* * * * *